(12) United States Patent
Kim et al.

(10) Patent No.: US 11,995,277 B2
(45) Date of Patent: May 28, 2024

(54) DISPLAY APPARATUS

(71) Applicant: Samsung Display Co., Ltd., Yongin-si (KR)

(72) Inventors: Kiwook Kim, Hwaseong-si (KR); Kyongtae Park, Suwon-si (KR); Hyesong Kwun, Bucheon-si (KR); Dae-won Lee, Seoul (KR); Donghoon Jeong, Seoul (KR); Won-kyu Kwak, Seongnam-si (KR); Kwangmin Kim, Seoul (KR); Joongsoo Moon, Hwaseong-si (KR); Changkyu Jin, Anyang-si (KR); Kyu-sik Cho, Suwon-si (KR); Sungho Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/200,814

(22) Filed: May 23, 2023

(65) Prior Publication Data
US 2023/0350524 A1 Nov. 2, 2023

Related U.S. Application Data

(63) Continuation of application No. 17/838,616, filed on Jun. 13, 2022, now Pat. No. 11,720,213, which is a
(Continued)

(30) Foreign Application Priority Data

Mar. 14, 2017 (KR) .......................... 10-2017-0032016
Jul. 26, 2017 (KR) .......................... 10-2017-0094876

(51) Int. Cl.
*G06F 3/044* (2006.01)
*G06F 3/041* (2006.01)
(Continued)

(52) U.S. Cl.
CPC .......... *G06F 3/0443* (2019.05); *G06F 3/0412* (2013.01); *G06F 3/0446* (2019.05);
(Continued)

(58) Field of Classification Search
CPC ... G06F 3/0412; G06F 3/0446; H10K 50/844; H10K 59/131; H10K 59/40; H10K 59/88; H10K 77/10
See application file for complete search history.

(56) References Cited

U.S. PATENT DOCUMENTS 7,342,563 B2 3/2008 Eguchi et al.
7,580,107 B2 8/2009 Moon
(Continued)

FOREIGN PATENT DOCUMENTS

CN 104241544 12/2014
CN 104701342 6/2015
(Continued)

*Primary Examiner* — Sardis F Azongha
(74) *Attorney, Agent, or Firm* — CANTOR COLBURN LLP

(57) ABSTRACT

A display apparatus includes a substrate including a display region and a non-display region, a display element layer, a pad group, a touch electrode layer, and a touch insulating layer. The display element layer includes display elements provided in the display region in a plan view. The pad group may include output pads provided on substrate and provided in the non-display region in the plan view. The touch electrode layer is provided on the display element layer. The touch insulating layer is provided on the display element layer and contacts the touch electrode layer. An intaglio pattern is provided in the touch insulating layer overlapped with the non-display region, and the intaglio pattern is not overlapped with the pad group.

20 Claims, 33 Drawing Sheets

Related U.S. Application Data continuation of application No. 17/240,054, filed on Apr. 26, 2021, now Pat. No. 11,360,621, which is a continuation of application No. 16/839,325, filed on Apr. 3, 2020, now Pat. No. 10,990,233, which is a continuation of application No. 15/920,801, filed on Mar. 14, 2018, now Pat. No. 10,615,242.

(51) Int. Cl.
*H01L 23/00* (2006.01)
*H10K 50/844* (2023.01)
*H10K 59/131* (2023.01)
*H10K 59/40* (2023.01)
*H10K 59/88* (2023.01)
*H10K 77/10* (2023.01)

(52) U.S. Cl.
CPC .............. *H01L 24/04* (2013.01); *H01L 24/16* (2013.01); *H01L 24/29* (2013.01); *H01L 24/32* (2013.01); *H01L 24/73* (2013.01); *H10K 50/844* (2023.02); *H10K 59/131* (2023.02); *H10K 59/40* (2023.02); *H10K 59/88* (2023.02); *H10K 77/111* (2023.02); *G06F 2203/04111* (2013.01); *H01L 2224/02145* (2013.01); *H01L 2224/0221* (2013.01); *H01L 2224/04026* (2013.01); *H01L 2224/16148* (2013.01); *H01L 2224/29198* (2013.01); *H01L 2224/32148* (2013.01); *H01L 2224/73204* (2013.01); *H01L 2924/1426* (2013.01)

(56) References Cited

U.S. PATENT DOCUMENTS

| | | |
|---|---|---|
| 9,046,955 B1 | 6/2015 | Lee et al. |
| 9,048,444 B2 | 6/2015 | Kim et al. |
| 9,136,315 B1 | 9/2015 | Kim et al. |
| 9,236,424 B2 | 1/2016 | Kesho et al. |
| 9,244,573 B2 | 1/2016 | Ryu et al. |
| 9,287,329 B1 | 3/2016 | Lee et al. |
| 9,525,012 B2 | 12/2016 | Lim et al. |
| 9,614,183 B2 | 4/2017 | Zhang et al. |
| 9,954,043 B2 | 4/2018 | Park et al. |
| 10,050,090 B2 | 8/2018 | Okazaki |
| 10,168,844 B2 | 1/2019 | Kwon et al. |
| 10,572,057 B2 | 2/2020 | Lee et al. |
| 10,901,541 B2 | 1/2021 | Ko et al. |
| 2003/0127652 A1 | 7/2003 | Park et al. |
| 2012/0299888 A1 | 11/2012 | Kim et al. |
| 2014/0367658 A1 | 12/2014 | Kwak |
| 2015/0060778 A1 | 3/2015 | Kim et al. |
| 2015/0162392 A1 | 6/2015 | Lim et al. |
| 2016/0270209 A1 | 9/2016 | Cho |
| 2016/0284770 A1 | 9/2016 | Kim |
| 2017/0162822 A1 | 6/2017 | Park et al. |
| 2018/0165996 A1 | 6/2018 | Ochi et al. |

FOREIGN PATENT DOCUMENTS

| | | |
|---|---|---|
| CN | 105280670 | 1/2016 |
| CN | 106293197 | 1/2017 |
| JP | 200366113 A | 3/2003 |
| JP | 2014215545 A | 11/2014 |
| JP | 20152177 A | 1/2015 |
| JP | 201550181 A | 3/2015 |
| JP | 2016152047 A | 8/2016 |
| KR | 100895311 B1 | 5/2009 |
| KR | 100943730 B1 | 2/2010 |
| KR | 101341030 B1 | 12/2013 |
| KR | 101427135 B1 | 8/2014 |
| KR | 1020140098937 A | 8/2014 |
| KR | 1020140146510 A | 12/2014 |
| KR | 1020150010411 A | 1/2015 |
| KR | 1020150065554 A | 6/2015 |
| KR | 1020160110688 A | 9/2016 |
| TW | 201203064 A1 | 1/2012 |
| WO | 2016204121 A1 | 12/2016 |

DISPLAY APPARATUS

This application is a continuation of U.S. patent application Ser. No. 17/838,616, filed on Jun. 13, 2022, which is a continuation of U.S. patent application Ser. No. 17/240,054, filed on Apr. 26, 2021, which is a continuation of U.S. patent application Ser. No. 16/839,325, filed on Apr. 3, 2020, which is a continuation of U.S. patent application Ser. No. 15/920,801, filed on Mar. 14, 2018, which claims priority to Korean Patent Application Nos. 10-2017-0032016 and 10-2017-0094876, filed on Mar. 14, 2017 and Jul. 26, 2017, respectively, and all the benefits accruing therefrom under 35 U.S.C. § 119, the contents of which in their entirety are herein incorporated by reference.

BACKGROUND

1. Field

Exemplary embodiments of the invention relate to a display apparatus, and in particular, to a flexible display apparatus.

2. Description of the Related Art

Various display apparatuses are being developed for use in multimedia devices such as televisions, mobile phones, tablet computers, navigation systems, gaming machines, and the like. In accordance with recent technical progress, a flexible display apparatus has been developed, for example.

SUMMARY

When a flexible display apparatus is bent, stress is exerted on the flexible display apparatus, thereby causing damage to internal parts.

According to some exemplary embodiments of the invention, a touch insulating layer may have an intaglio pattern capable of preventing a delamination problem, which may occur between the touch insulating layer and an interlayered insulating layer, causing a short circuit between output and input pads.

According to some exemplary embodiments of the invention, a display apparatus may include a substrate, signal lines, a display element layer, a pad group, an intermediate insulating layer, a touch electrode layer, and a touch insulating layer.

In an exemplary embodiment, the substrate may include a display region and a non-display region outside the display region.

In an exemplary embodiment, the signal lines may be provided on the substrate.

In an exemplary embodiment, the display element layer may be provided on the signal lines and may include display elements provided in the display region in a plan view.

In an exemplary embodiment, the pad group may include output pads, which are electrically connected to the signal lines and are provided in the non-display region in the plan view.

In an exemplary embodiment, the intermediate insulating layer may be provided between the signal lines and the display element layer to expose the output pads.

In an exemplary embodiment, the touch electrode layer may be provided on the display element layer.

In an exemplary embodiment, the touch insulating layer may be provided on the display element layer. The touch insulating layer may contact the touch electrode layer and may define an intaglio pattern in the non-display region in the plan view.

In an exemplary embodiment, the intaglio pattern may be located between the output pads and the intermediate insulating layer in the plan view.

According to other exemplary embodiments of the invention, a display apparatus may include a substrate, signal lines, a display element layer, a pad group, a driving circuit chip, a touch electrode layer, and a touch insulating layer.

In an exemplary embodiment, the substrate may include a display region and a non-display region outside the display region.

In an exemplary embodiment, the signal lines may be provided on the substrate.

In an exemplary embodiment, the display element layer may be provided on the signal lines and may include display elements provided in the display region in a plan view.

In an exemplary embodiment, the pad group may include output pads, which are electrically connected to the signal lines and are provided in the non-display region in the plan view.

In an exemplary embodiment, the driving circuit chip may contact the pad group and may provide signals to the signal lines.

In an exemplary embodiment, the touch electrode layer may be provided on the display element layer.

In an exemplary embodiment, the touch insulating layer may be provided on the display element layer to define an intaglio pattern in the non-display region in the plan view.

In an exemplary embodiment, the intaglio pattern may be not overlapped with the pad group and may be overlapped with the driving circuit chip.

According to still other exemplary embodiments of the invention, a display apparatus may include a substrate, a display element layer, a pad group, a touch electrode layer, and a touch insulating layer.

In an exemplary embodiment, the substrate may include a display region and a non-display region outside the display region.

In an exemplary embodiment, the display element layer may be provided on the substrate and may include display elements provided in the display region in a plan view.

In an exemplary embodiment, the pad group may be provided on the substrate and may include output pads, which are provided in the non-display region in the plan view.

In an exemplary embodiment, the touch electrode layer may be provided on the display element layer.

In an exemplary embodiment, the touch insulating layer may be provided on the display element layer and contact the touch electrode layer.

In an exemplary embodiment, an intaglio pattern may be provided in the touch insulating layer overlapped with the non-display region, and the intaglio pattern may be not overlapped with the pad group.

BRIEF DESCRIPTION OF THE DRAWINGS

Exemplary embodiments will be more clearly understood from the following brief description taken in conjunction with the accompanying drawings. The accompanying drawings represent non-limiting, exemplary embodiments as described herein.

DETAILED DESCRIPTION

Figure 1:
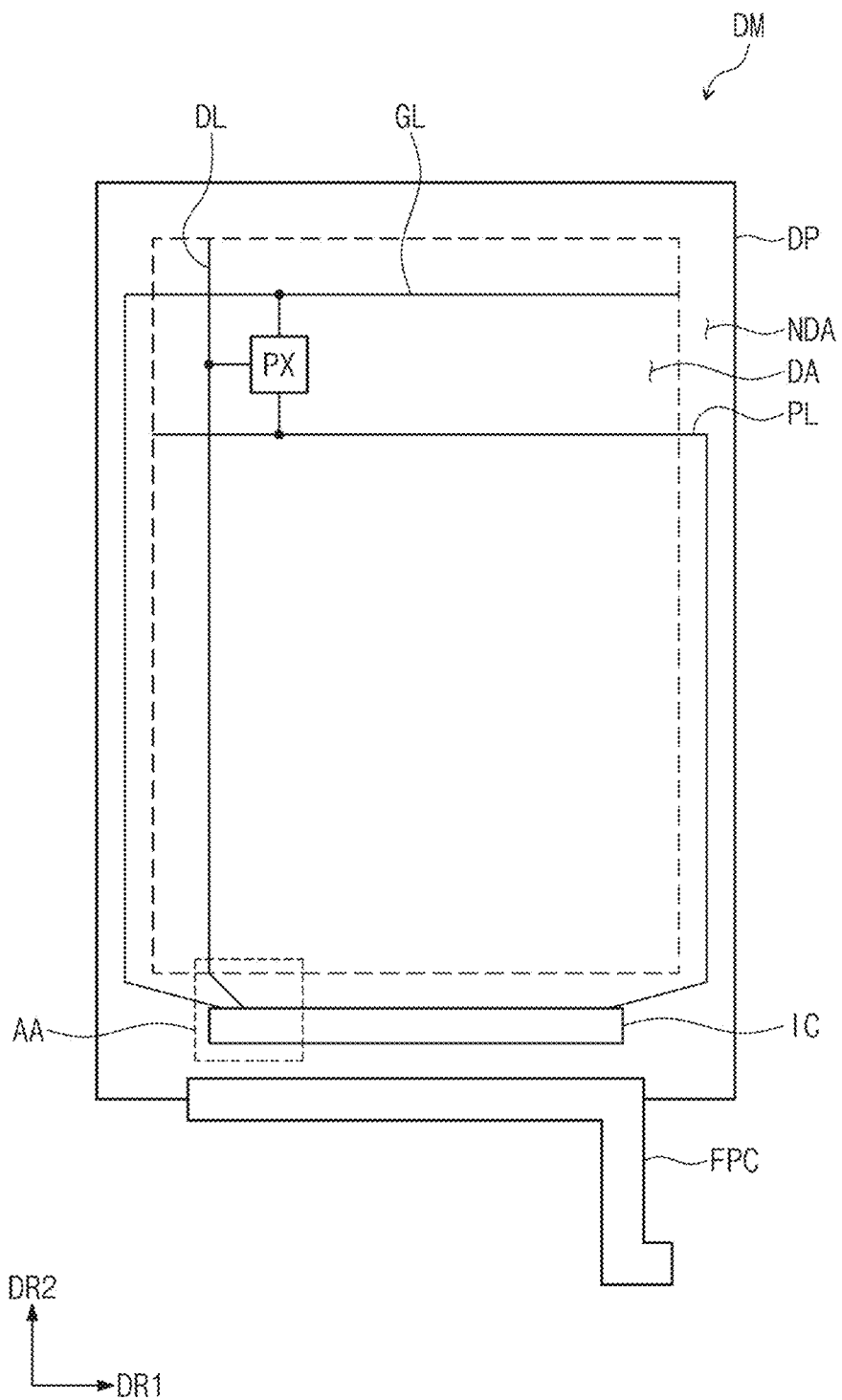
FIG. 1 is a plan view of an exemplary embodiment of a display apparatus according to the invention.

Exemplary embodiments of the invention will now be described more fully with reference to the accompanying drawings, in which exemplary embodiments are shown. Exemplary embodiments of the invention may, however, be embodied in many different forms and should not be construed as being limited to the exemplary embodiments set forth herein, rather, these embodiments are provided so that this invention will be thorough and complete, and will fully convey the concept of exemplary embodiments to those of ordinary skill in the art. In the drawings, the thicknesses of layers and regions are exaggerated for clarity. Like reference numerals in the drawings denote like elements, and thus their description will be omitted.

It should be noted that these drawing figures are intended to illustrate the general characteristics of methods, structure and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures. For example, if the device in the drawing figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Exemplary embodiments of the invention are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which exemplary embodiments of the invention belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view of a display apparatus DM according to some exemplary embodiments of the invention.

Referring to FIG. 1, the display apparatus DM may include a display panel DP, a driving circuit chip IC, and a flexible printed circuit board FPC.

The display panel DP may be a light-emitting type display panel, but the invention is not limited thereto. In an exemplary embodiment, the display panel DP may be an organic light-emitting display panel or a quantum-dot light-emitting display panel, for example. The organic light-emitting display panel may include an organic light-emitting material that is used as a light-emitting layer. The quantum-dot light-emitting display panel may include quantum dots and quantum rods which are used as a light-emitting layer. For the sake of simplicity, the description that follows will refer to an example in which the display panel DP is the organic light-emitting display panel.

The display panel DP may include a display region DA and a non-display region NDA adjacent to the display region DA. The non-display region NDA may not display an image. In an exemplary embodiment, the display region DA may have, for example, a rectangular shape. The non-display region NDA may enclose the display region DA. However, the invention is not limited thereto, and the shapes of the display region DA and the non-display region NDA may be various changed.

Hereinafter, a direction of a short side of the display panel DP will be referred to as a first direction DR1, a direction of a long side of the display panel DP will be referred to as a second direction DR2, and a direction normal to a top surface of the display panel DP, i.e., a direction perpendicular to the first direction DR1 and the second direction DR2, will be referred to as a third direction.

The display panel DP may include a plurality of signal lines and a plurality of pixels PX.

The signal lines may include a scan line GL, a data line DL, and a power line PL. The number of each of the scan, data, and power lines GL, DL, and PL provided in display panel DP may be two or more, but for convenience in illustration, each of the scan, data, and power lines GL, DL, and PL is singly illustrated in FIG. 1. The scan line GL, the data line DL, and the power line PL may be connected to the pixel PX. Also, FIG. 1 illustrates an example in which the scan line GL, the data line DL, and the power line PL are connected to the driving circuit chip IC. However, the invention is not limited thereto, and some of the scan line GL, the data line DL, and the power line PL may be connected to the flexible printed circuit board FPC to receive driving signals.

The signal lines may be provided by patterning a first conductive layer and a second conductive layer, which are provided at different levels. The stacking structure of the first and second conductive layers will be described in more detail below.

The display panel DP may include a scan driving circuit (not shown) provided in the non-display region NDA. The scan driving circuit (not shown) may be used to receive a driving signal from the driving circuit chip IC or the flexible printed circuit board FPC and then to provide the scan signal to the scan line GL.

The pixel PX may be connected to the scan line GL and the data line DL and may be used to display an image. In an exemplary embodiment, the pixel PX may display one of red, green, and blue colors, for example. However, the invention is not limited thereto, and for example, the pixel PX may display one of other colors (e.g., white), except for the red, green, and blue colors. Although FIG. 1 illustrates an example in which the pixel PX has a rectangular shape, the invention is not limited thereto. In an exemplary embodiment, the pixel PX may have at least one of various shapes, such as polygonal, circular, elliptical shapes.

The driving circuit chip IC may be attached to the non-display region NDA of the display panel DP. The driving circuit chip IC may provide various signals, which are desired to drive the display panel DP, to the display panel DP. The driving circuit chip IC may be used as a source driving circuit for providing data signals to the data line DL. However, the invention is not limited thereto, and the driving circuit chip IC may also serve as a scan driving circuit for providing scan signals to the scan line GL. In an exemplary embodiment, the driving circuit chip IC may be an integrated circuit, in which the source driving circuit and the scan driving circuit are integrated, for example, and in this case, the scan driving circuit may be omitted from the display panel DP.

In some exemplary embodiments, the driving circuit chip IC may be disposed (e.g., mounted) on the display panel DP in in a chip-on-panel ("COP") manner, for example.

The flexible printed circuit board FPC may be connected to an end portion of the display panel DP in the second direction DR2. The flexible printed circuit board FPC may be directly connected to the signal lines provided in the display panel DP or may be connected to the driving circuit chip IC to transmit signals from the outside to the display panel DP.

Figure 2:
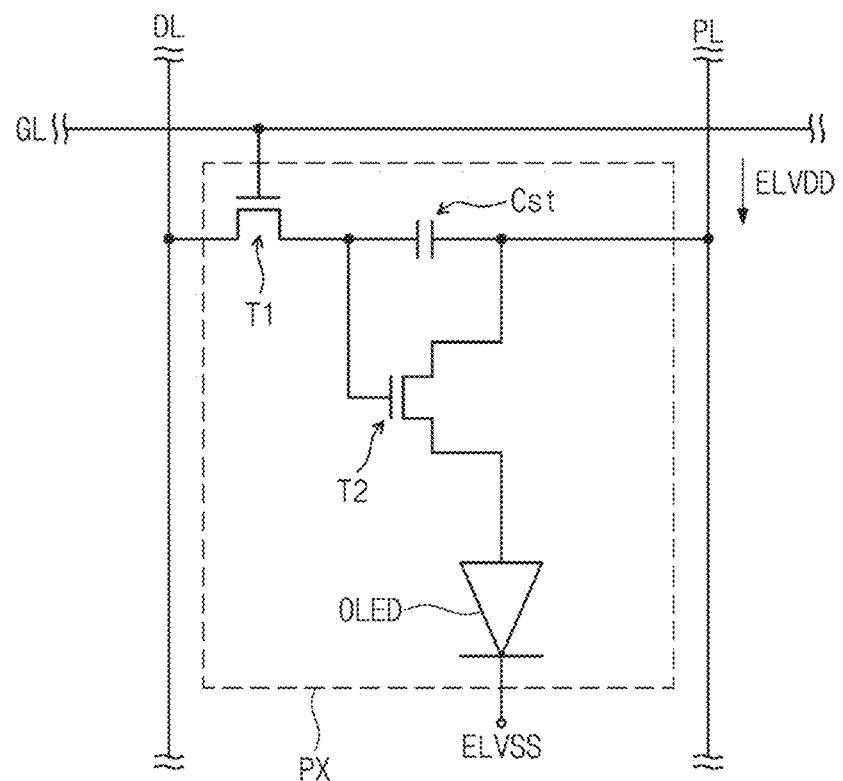
FIG. 2 is an equivalent circuit diagram of a single pixel.

FIG. 2 is an equivalent circuit diagram of the pixel PX. FIG. 2 illustrates an example of the pixel PX that is connected to the scan line GL, the data line DL, and the power line PL. The structure of the pixel PX is not limited to this example and may be variously changed.

In an exemplary embodiment, an organic light-emitting diode OLED may be a top-emission type diode or a bottom-emission type diode, for example. The pixel PX may include a first OR switching transistor T1, a second OR driving transistor T2, and a capacitor Cst, which are used as a pixel driving circuit for driving the organic light-emitting diode OLED. A first power voltage ELVDD may be the second transistor T2, and a second power voltage ELVSS may the organic light-emitting diode OLED. The second power voltage ELVSS may be lower than the first power voltage ELVDD.

If a scan signal is applied to the scan line GL, the first transistor T1 may output a data signal applied to the data line DL in response to the scan signal. The capacitor Cst may be charged to have a voltage corresponding to the data signal, which is transmitted from the first transistor T1.

The second transistor T2 may be connected to the organic light-emitting diode OLED. The second transistor T2 may control a driving current flowing through the organic light emitting diode OLED, based on an amount of charges stored in the capacitor Cst. The organic light-emitting diode OLED may emit light, when the second transistor T2 is in a turn-on period.

Figure 3:
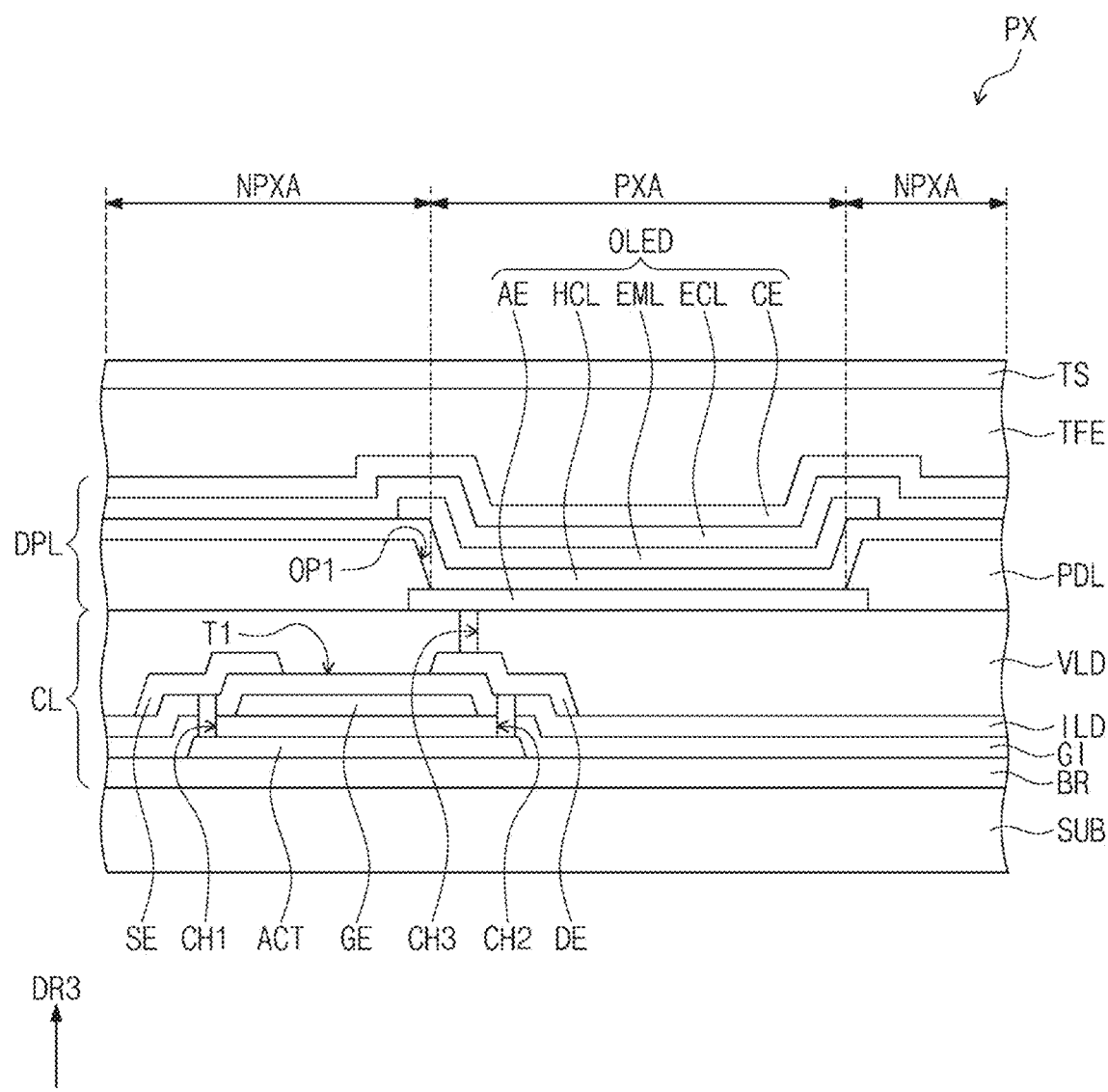
FIG. 3 is a cross-sectional view illustrating a portion of a display panel corresponding to a single pixel.

FIG. 3 is a cross-sectional view illustrating a portion of a display panel corresponding to the pixel PX.

The display panel DP may include a substrate SUB, a circuit device layer CL, a display element layer DPL, a thin-film encapsulation layer TFE, and a touch sensor TS. Although not shown, the display panel DP may further include an anti-reflection layer and/or a window member, which are provided on the touch sensor TS.

The substrate SUB may include at least one plastic film. The substrate SUB may be flexible. In an exemplary embodiment, the substrate SUB may be or include a plastic substrate, a glass substrate, a metal substrate, or a substrate including an organic/inorganic composite material. The display region DA and the non-display region NDA described with reference to FIG. 1 may be defined in the substrate SUB in the same manner.

The circuit device layer CL may include the signal lines (e.g., the scan line GL, the data line DL, and the power line PL) described with reference to FIG. 2. Also, the circuit device layer CL may include the first transistor T1, the second transistor T2, and the capacitor Cst. The first transistor T1 will be exemplarily described with reference to FIG. 3.

The circuit device layer CL may include a barrier layer BR, an active layer ACT, a gate insulating layer GI, a gate electrode GE, an interlayered insulating layer ILD, input and output electrodes SE and DE, and an intermediate insulating layer VLD.

The barrier layer BR may be provided on the substrate SUB to prevent foreign substance from being infiltrating into layers that are provided on the barrier layer BR.

Although not shown, the display panel DP may further include a buffer layer (not shown) provided on the barrier layer BR. The buffer layer (not shown) may also improve adhesion characteristics between the substrate SUB and a layer thereon. The barrier layer BR and the buffer layer (not shown) may be optionally provided in or omitted from the display panel DP.

The active layer ACT may be provided on the barrier layer BR. The active layer ACT may serve as a channel region of the first transistor T1. In an exemplary embodiment, the active layer ACT may consist of or include at least one of amorphous silicon, poly silicon, or metal oxide semiconductor materials, for example.

The gate insulating layer GI may be provided on the active layer ACT. The gate insulating layer GI may electrically disconnect the gate electrode GE from the active layer ACT.

The gate electrode GE may be provided on the gate insulating layer GI. The gate electrode GE may be overlapped with the active layer ACT.

A first conductive layer (not shown) constituting the signal lines may be provided at the same level as that of the gate electrode GE.

The interlayered insulating layer ILD may be provided on the gate electrode GE. The interlayered insulating layer ILD may electrically disconnect the gate electrode GE from the input and output electrodes SE and DE. The interlayered insulating layer ILD may consist of or include an inorganic material. In an exemplary embodiment, the inorganic material may include silicon nitride, silicon oxynitride, and silicon oxide, for example.

The input and output electrodes SE and DE may be provided on the interlayered insulating layer ILD. The input and output electrodes SE and DE may be electrically connected to the active layer ACT through first and second contact holes CH1 and CH2, respectively, which are defined in the interlayered insulating layer ILD and the gate insulating layer GI.

A second conductive layer (not shown) constituting the signal lines may be provided at the same level as that of the input and output electrodes SE and DE.

In the above-described embodiments, the display panel DP has been described to have a top-gate structure in which the gate electrode GE is provided on the active layer ACT, but in other exemplary embodiments, the display panel DP may have a bottom-gate structure in which the gate electrode GE is provided below the active layer ACT.

The intermediate insulating layer VLD may be provided on the input and output electrodes SE and DE. The intermediate insulating layer VLD may have a flat top surface. The intermediate insulating layer VLD may consist of or include an organic material. In an exemplary embodiment, the organic material may include at least one of acrylic resins, methacryl resins, polyisoprene resins, vinyl resins, epoxy resins, urethane resins, cellulose resins, siloxane resins, polyimide resins, polyamide resins, or perylene resins, for example.

The display element layer DPL may be provided on the intermediate insulating layer VLD. The display element layer DPL may include a pixel definition layer PDL and a display element. In some exemplary embodiments, the display element may be the organic light-emitting diode OLED. The organic light-emitting diode OLED may include a first electrode AE, a hole control layer HCL, a light-emitting layer EML, an electron control layer ECL, and a second electrode CE.

The pixel definition layer PDL may consist of or include an organic material. The first electrode AE may be provided on the intermediate insulating layer VLD. The first electrode AE may be connected to the output electrode DE through a third contact hole CH3 penetrating the intermediate insulating layer VLD. The pixel definition layer PDL may define a first opening OP1. The first opening OP1 of the pixel definition layer PDL may expose at least a portion of the first electrode AE.

The pixel PX may be provided in a pixel region in a plan view. The pixel region may include a light-emitting region PXA and a non-light-emitting region NPXA adjacent to the light-emitting region PXA. The non-light-emitting region NPXA may enclose the light-emitting region PXA. In the illustrated exemplary embodiment, the light-emitting region PXA may be defined to correspond to a region of the first electrode AE exposed by the first opening OP1.

The hole control layer HCL may be provided in common in the light-emitting region PXA and the non-light-emitting region NPXA. Although not shown, a common layer, such as the hole control layer HCL, may be provided in common in a plurality of the pixels PX.

The light-emitting layer EML may be provided on the hole control layer HCL. The light-emitting layer EML may be provided in a region corresponding to the first opening OP1. In other words, the light-emitting layer EML may include a plurality of patterns that are separately provided in the plurality of pixels PX, respectively. The light-emitting layer EML may include an organic material and/or an inorganic material. In the illustrated exemplary embodiment, the light emitting layer EML is illustrated to have a patterned structure, but in other exemplary embodiments, the light emitting layer EML may be provided in common to span the plurality of pixels PX. In this case, the light emitting layer EML may emit a white-color light. In other exemplary embodiments, the light emitting layer EML may have a multi-layered structure.

The electron control layer ECL may be provided on the light-emitting layer EML. Although not shown, the electron control layer ECL may be provided in common in the plurality of pixels PX.

The second electrode CE may be provided on the electron control layer ECL. The second electrode CE may be provided in common in the plurality of pixels PX.

The thin-film encapsulation layer TFE may be provided on the second electrode CE. The thin-film encapsulation layer TFE may be provided in common in the plurality of pixels PX. In the illustrated exemplary embodiment, the thin-film encapsulation layer TFE may directly cover the second electrode CE. In other exemplary embodiments, a capping layer may be further provided between the thin-film encapsulation layer TFE and the second electrode CE to cover the second electrode CE. Here, the thin-film encapsulation layer TFE may directly cover the capping layer.

The thin-film encapsulation layer TFE may include at least one inorganic layer (hereinafter, an inorganic encapsulation layer). The thin-film encapsulation layer TFE may further include at least one organic layer (hereinafter, an organic encapsulation layer). The inorganic encapsulation layer may be used to protect the display element layer DPL from moisture or oxygen, and the organic encapsulation layer may be used to protect the display element layer DPL from a contamination material such as dust particles. In an exemplary embodiment, the inorganic encapsulation layer may consist of or include at least one of silicon nitride, silicon oxynitride, silicon oxide, titanium oxide, or aluminum oxide, for example. The organic encapsulation layer may consist of or include at least one of acrylic-based organic materials, for example, but the invention is not limited thereto.

The touch sensor TS may be provided on the thin-film encapsulation layer TFE. The touch sensor TS may obtain coordinate information on a position of an external input.

In some exemplary embodiments, the touch sensor TS may be directly provided on the thin-film encapsulation layer TFE. In the specification, the expression "be directly provided" is used to represent that two layers are successively provided so that one layer contacts a top of the other layer, without a step for forming an additional adhesive layer between the two layers.

The touch sensor TS may sense an external input, for example, in an electrostatic capacitance sensing manner. However, the invention is not limited to a specific sensing method of the touch sensor TS. In other exemplary embodiments, the touch sensor TS may sense an external input in an electromagnetic induction manner or a pressure-sensing manner, for example.

The touch sensor TS may have a multi-layered structure. The touch sensor TS may include one or more conductive layers. The touch sensor TS may include one or more insulating layers.

Figure 4:
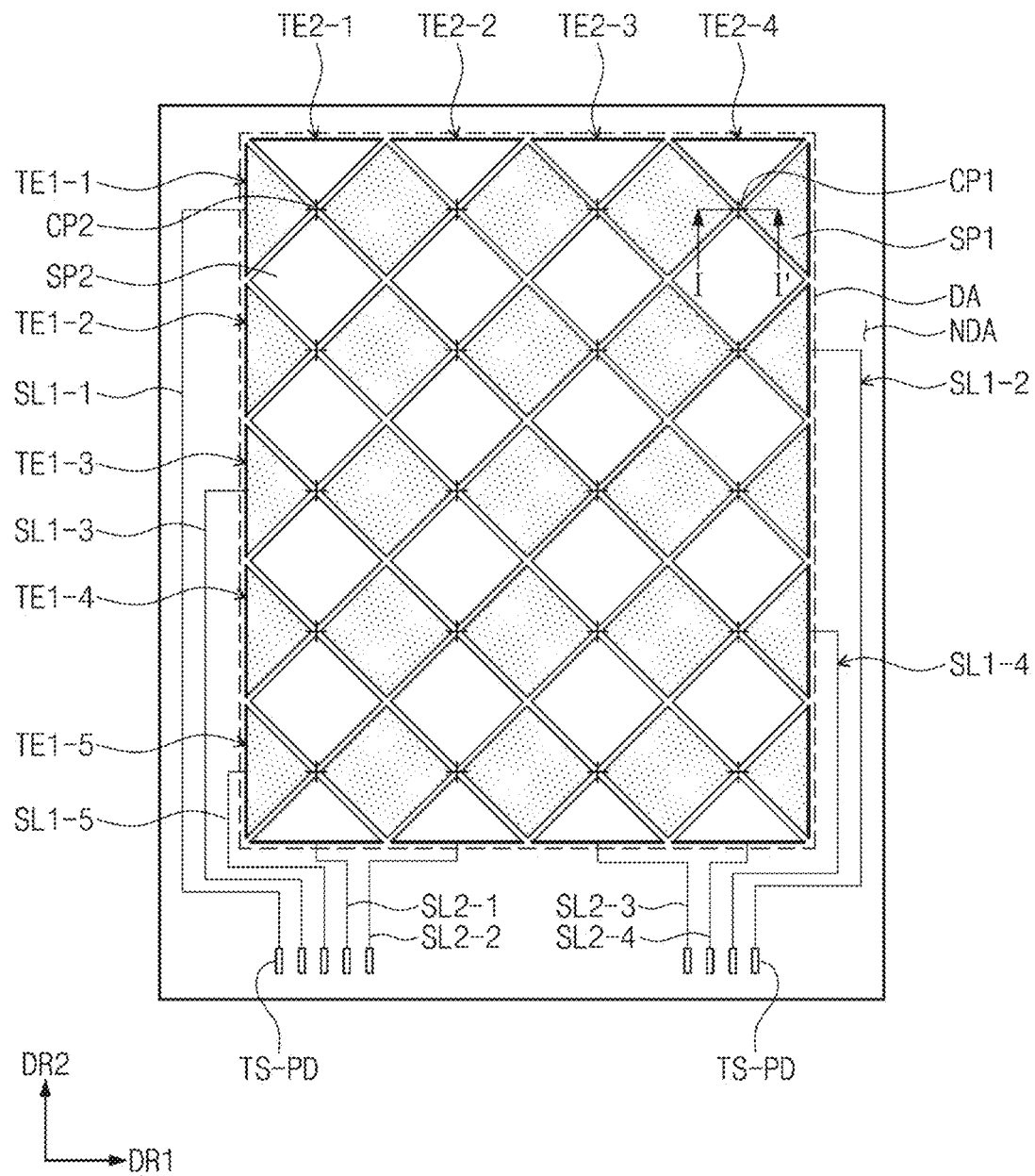
FIG. 4 is a plan view illustrating a touch sensor of FIG. 3.
Figure 5:
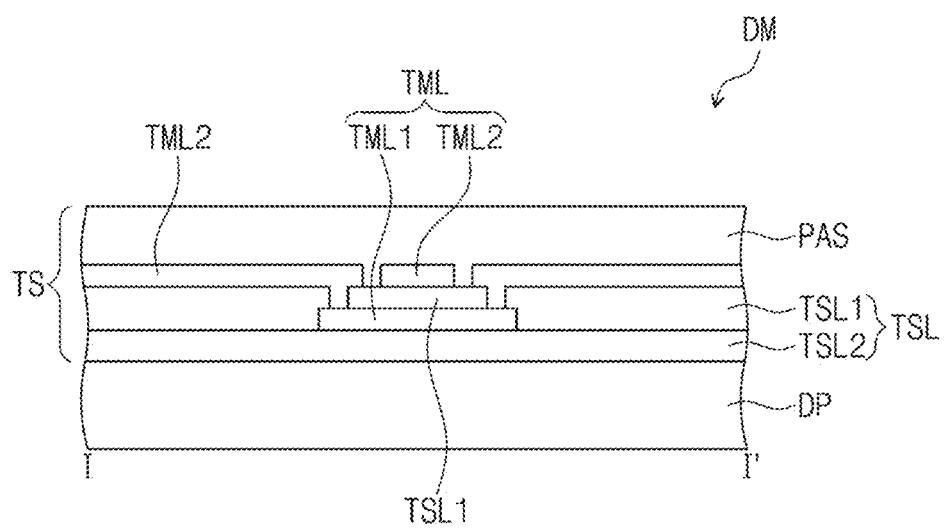
FIG. 5 is a cross-sectional view taken along line I-I' of FIG. 4.

FIG. 4 is a plan view illustrating a touch sensor of FIG. 3, and FIG. 5 is a cross-sectional view taken along line I-I' of FIG. 4.

The touch sensor TS may include a touch electrode layer TML and a touch insulating layer TSL. The touch insulating layer TSL may contact the touch electrode layer TML.

The touch electrode layer TML may include a first touch electrode layer TML1 and a second touch electrode layer TML2. The touch insulating layer TSL may include a first touch insulating layer TSL1 and a second touch insulating layer TSL2.

The second touch electrode layer TML2 may be provided on the first touch electrode layer TML1.

Each of the first and second touch electrode layers TML1 and TML2 may have a single-layered structure or a multi-layered structure including at least one conductive layer. The conductive layer of the multi-layered structure may include at least two conductive layers that are selected from transparent conductive layers and metal layers. The conductive layer of the multi-layered structure may include at least two metal layers including different metals from each other. In an exemplary embodiment, the transparent conductive layers may consist of or include at least one of indium tin oxide ("ITO"), indium zinc oxide ("IZO"), zinc oxide (ZnO), indium tin zinc oxide ("ITZO"), PEDOT, metal nano wire, or graphene, for example. In an exemplary embodiment, the metal layer may consist of or include at least one of molybdenum, silver, titanium, copper, aluminum, or alloys thereof, for example. In an exemplary embodiment, each of the first touch electrode layer TML1 and the second touch electrode layer TML2 may have a triple-layered structure including two titanium layers and an aluminum layer interposed therebetween, for example.

The first touch insulating layer TSL1 may be provided between the first touch electrode layer TML1 and the second touch electrode layer TML2. The second touch insulating layer TSL2 may be provided between the uppermost layer (e.g., the thin-film encapsulation layer TFE) of the display panel DP and the first touch electrode layer TML1. However, the invention is not limited thereto, and in other exemplary embodiments, the second touch insulating layer TSL2 may be optionally omitted.

The first touch insulating layer TSL1 and the second touch insulating layer TSL2 may consist of or include an inorganic material. In an exemplary embodiment, the inorganic material may include silicon nitride, silicon oxynitride, and silicon oxide, for example.

The touch sensor TS may further include a planarization layer PAS provided on the second touch electrode layer TML2. The planarization layer PAS may have a flat surface and may consist of or include an organic material.

As shown in FIG. 4, the touch sensor TS may include first touch electrodes TE1-1 to TE1-5, first touch signal lines SL1-1 to SL1-5, which are connected to the first touch electrodes TE1-1 to TE1-5, second touch electrodes TE2-1 to TE2-4, second touch signal lines SL2-1 to SL2-4, which are connected to the second touch electrodes TE2-1 to TE2-4, and touch pads TS-PD, which are connected to the first touch signal lines SL1-1 to SL1-5 and the second touch signal lines SL2-1 to SL2-4.

Each of the first touch electrodes TE1-1 to TE1-5 may have a mesh shape, in which a plurality of touch openings is defined. Each of the first touch electrodes TE1-1 to TE1-5 may include a plurality of first touch sensor units SP1 and a plurality of first connecting portions CP1. The first touch sensor units SP1 may be arranged in the first direction DR1. Each of the first connecting portions CP1 may connect two adjacent ones of the first touch sensor units SP1 to each other. Although not shown, the first touch signal lines SL1-1 to SL1-5 may have a mesh shape.

The second touch electrodes TE2-1 to TE2-4 may be electrically disconnected from the first touch electrodes TE1-1 to TE1-5 and may cross the first touch electrodes TE1-1 to TE5. Each of the second touch electrodes TE2-1 to TE2-4 may have a mesh shape, in which a plurality of touch openings is defined. Each of the second touch electrodes TE2-1 to TE2-4 may include a plurality of second touch sensor units SP2 and a plurality of second connecting portions CP2. The second touch sensor units SP2 may be arranged in the second direction DR2. Each of the second connecting portions CP2 may connect two adjacent ones of the second touch sensor units SP2 to each other. The second touch signal lines SL2-1 to SL2-4 may also have a mesh shape.

The first touch electrodes TE1-1 to TE1-5 may be capacitively coupled with the second touch electrodes TE2-1 to TE2-4. Touch sensing signals applied to the first touch electrodes TE1-1 to TE1-5 may change the capacitance between the first touch sensor units SP1 and the second touch sensor units SP2.

As an example of the illustrated exemplary embodiment, the plurality of the first connecting portions CP1 may be provided from the first touch electrode layer TML1, and the plurality of the first touch sensor units SP1, and the plurality of the second connecting portions CP2 may be provided from the second touch electrode layer TML2.

However, the invention is not limited thereto, and some of the first touch sensor units SP1, the first connecting portions CP1, the first touch signal lines SL1-1 to SL1-5, the second touch sensor units SP2, the second connecting portions CP2, and the second touch signal lines SL2-1 to SL2-4 may be provided from the first touch electrode layer TML1 shown in FIG. 5, and the others may be provided from the second touch electrode layer TML2 shown in FIG. 5.

Figure 6:
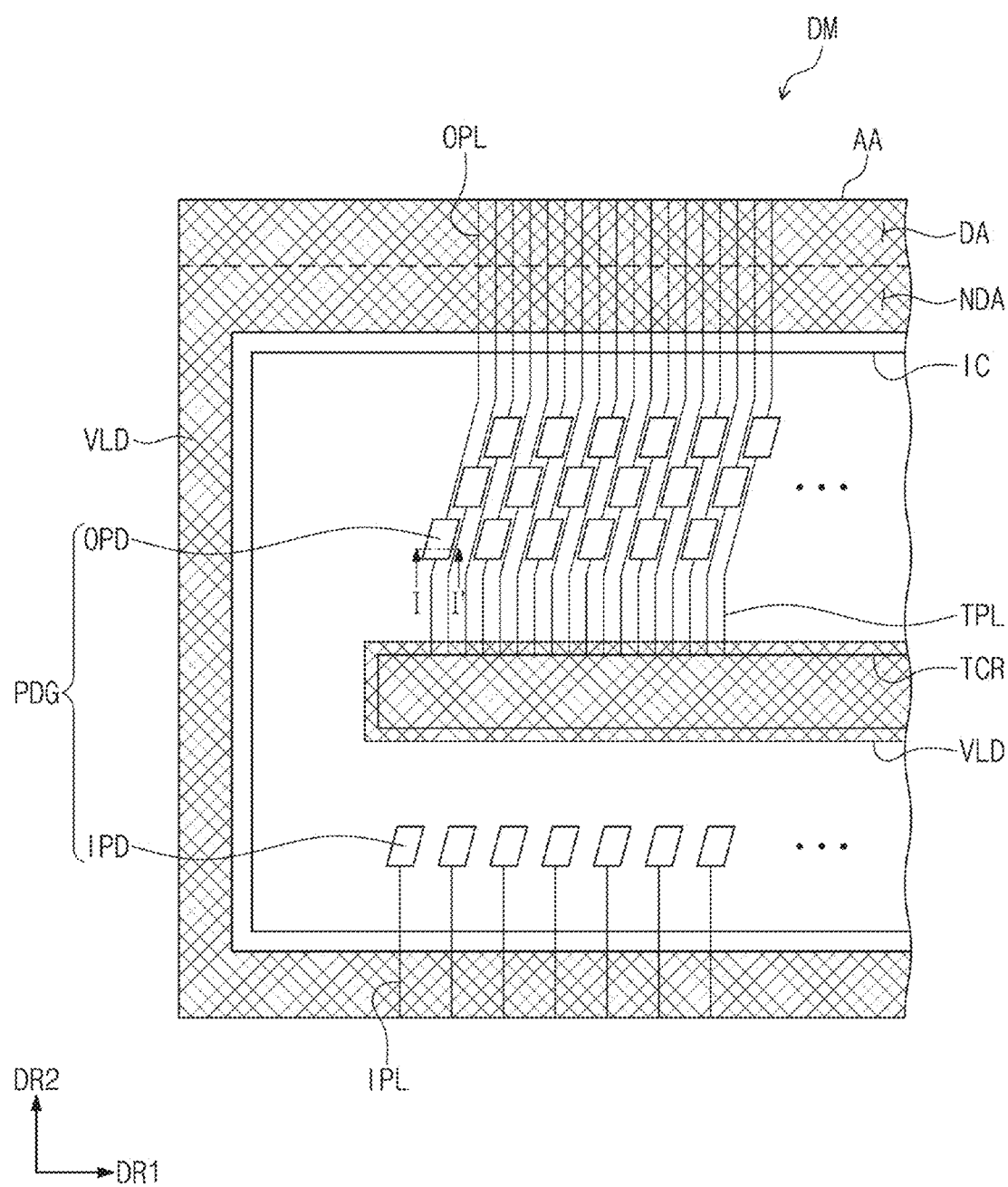
FIG. 6 is an enlarged plan view illustrating a region 'AA' of the display apparatus shown in FIG. 1.

FIG. 6 is an enlarged plan view illustrating a region 'AA' of the display apparatus shown in FIG. 1.

Referring to FIGS. 1 and 6, the display panel DP may further include a pad group PDG and a test circuit TCR, which are provided in the non-display region NDA.

The pad group PDG may include input pads IPD and output pads OPD. The output pads OPD may be arranged closer to the display region DA than the input pads IPD is to the display region DA. The driving circuit chip IC may be electrically connected to the display panel DP through the input pads IPD and the output pads OPD.

The display panel DP may further include output pad lines OPL and input pad lines IPL. The output pad lines OPL may connect the output pads OPD to some of the signal lines (e.g., data lines DL). The input pad lines IPL may connect the input pads IPD to the flexible printed circuit board FPC.

The driving circuit chip IC may receive signals, which are transmitted from the flexible printed circuit board FPC, through the input pad lines IPL and the input pads IPD. The driving circuit chip IC may provide signals to at least one of the scan line GL, the data line DL, and the power line PL through the output pads OPD and the output pad lines OPL.

The output pads OPD may be arranged in a plurality of rows. FIG. 6 illustrates an example in which the output pads OPD are arranged in three rows, but the invention is not limited thereto. The output pads OPD may be arranged in two or less rows or four or more rows.

FIG. 6 illustrates an example in which the input pads IPD are arranged in one row, but the invention is not limited thereto. In an exemplary embodiment, the input pads IPD may be arranged in plurality of rows.

The test circuit TCR may be overlapped with the driving circuit chip IC, in the non-display region NDA. The display panel DP may further include test pad lines TPL connecting the test circuit TCR to the output pads OPD.

The test circuit TCR may provide signals for testing operational characteristics of the display panel DP to the display panel DP through the test pad lines TPL and the output pads OPD, at a final stage before shipping products. After the shipping of the products, the test circuit TCR may be inactivated.

According to some exemplary embodiments of the invention, the test circuit TCR may be overlapped with the driving circuit chip IC, not with a portion of the non-display region NDA that is not overlapped with the driving circuit chip IC. Accordingly, it may be possible to reduce a size of the non-display region NDA and to more effectively utilize an area occupied by the display panel DP.

The intermediate insulating layer VLD may expose the pad group PDG, and this may make it possible to allow the pad group PDG to contact the driving circuit chip IC. The intermediate insulating layer VLD may cover the test circuit TCR and may protect the test circuit TCR.

In some exemplary embodiments, the touch insulating layer TSL (e.g., refer to FIG. 5) may define at least one intaglio pattern, which is provided near the pad group PDG in a plan view. This will be described in more detail below.

Figure 7:
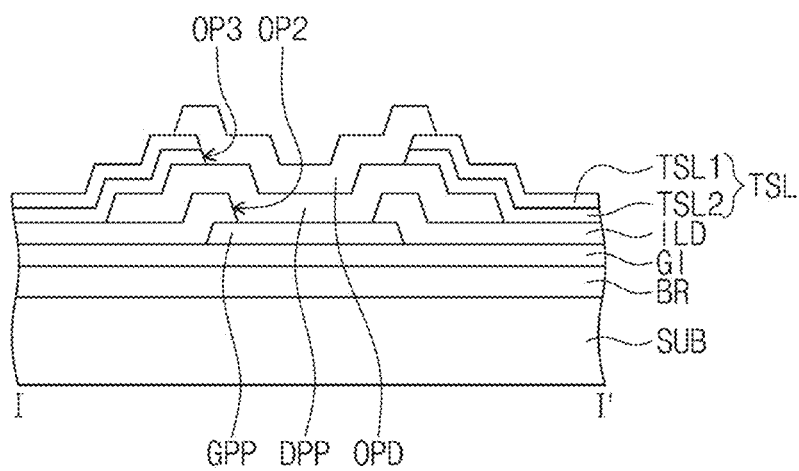
FIG. 7 is a cross-sectional view taken along line I-I' of FIG. 6.

FIG. 7 is a cross-sectional view taken along line I-I' of FIG. 6. A section structure of one of the output pads OPD will be described with reference to FIG. 7. The output pads OPD and the input pads IPD may have substantially the same structure.

Referring to FIGS. 1, 6, and 7, the display panel DP may include a data pad pattern DPP, which contacts the output pad OPD, and a gate pad pattern GPP.

The gate pad pattern GPP may be provided at the same level as the gate electrode GE shown in FIG. 3, the data pad pattern DPP may be provided at the same level as the input and output electrodes SE and DE shown in FIG. 3, and the output pad OPD may be provided at the same level as one of the first touch electrode layer TML1 and the second touch electrode layer TML2 shown in FIG. 5. In an exemplary embodiment, the output pad OPD may be provided at the same level as the second touch electrode layer TML2, for example. In other exemplary embodiments, the data pad pattern DPP may be omitted when necessary.

The output pad lines OPL and the test pad lines TPL may be provided at the same level as the gate pad pattern GPP and may be electrically connected to the gate pad pattern GPP.

The interlayered insulating layer ILD may define a second opening OP2 exposing at least a portion of the gate pad pattern GPP, and the gate pad pattern GPP and the data pad pattern DPP may contact each other through the second opening OP2.

The first touch insulating layer TSL1 and the second touch insulating layer TSL2 may define a third opening OP3 exposing at least a portion of the data pad pattern DPP, and the output pad OPD and the data pad pattern DPP may contact each other through the third opening OP3.

In some exemplary embodiments, the first touch insulating layer TSL1 and the second touch insulating layer TSL2 may include substantially the same material, and intaglio patterns having the same shape may be provided in the first touch insulating layer TSL1 and the second touch insulating layer TSL2. Thus, in the following description, the first touch insulating layer TSL1 and the second touch insulating layer TSL2 will not be described individually, but will be described as the touch insulating layer TSL. The expression "an intaglio pattern is provided in the touch insulating layer TSL" may mean that the intaglio pattern penetrates both of the first touch insulating layer TSL1 and the second touch insulating layer TSL2, for example.

Figure 8:
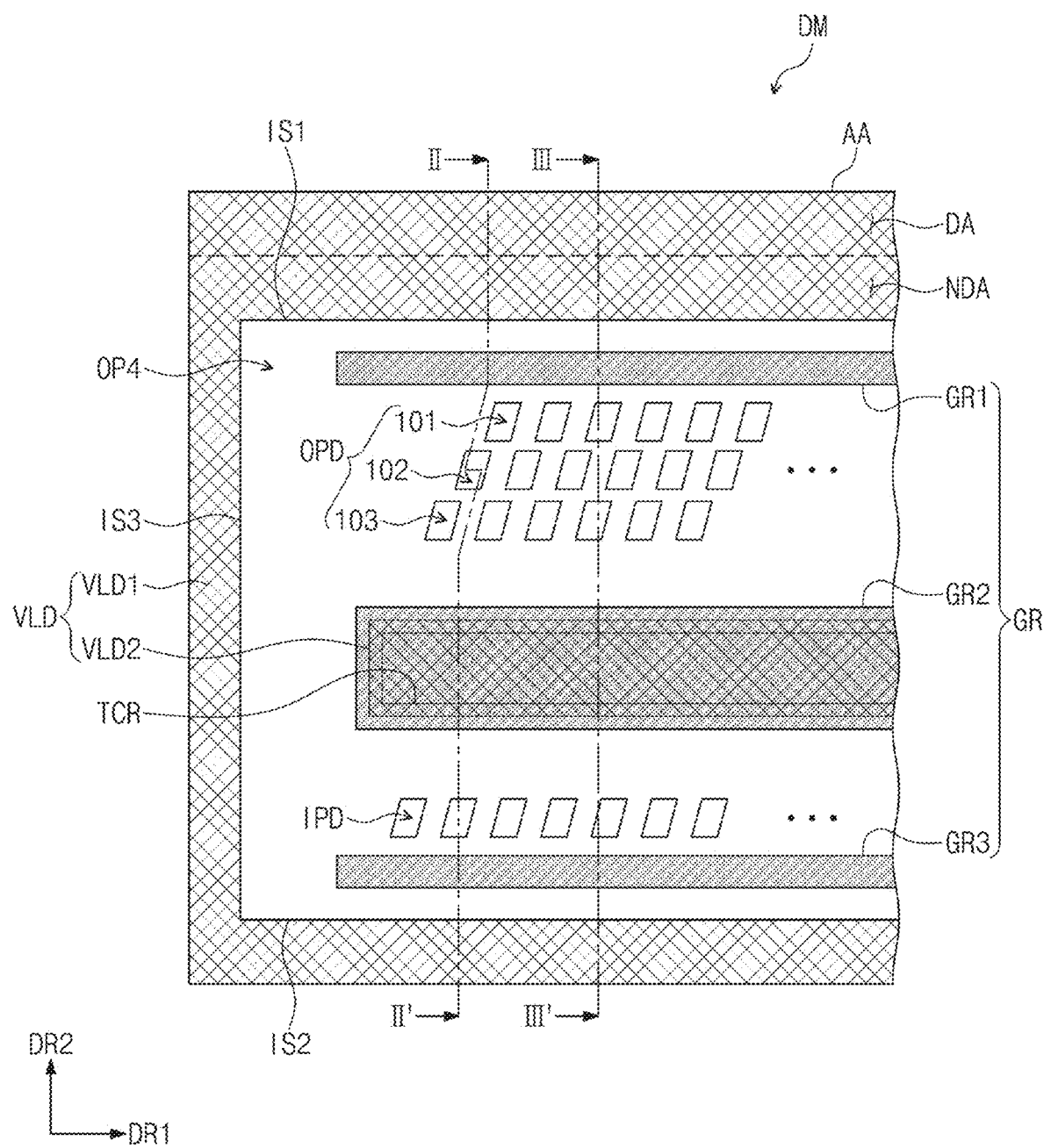
FIG. 8 is an enlarged plan view illustrating an exemplary embodiment of a shape of an intaglio pattern, which is provided in the region 'AA' of FIG. 1, according to the invention.
Figure 9:
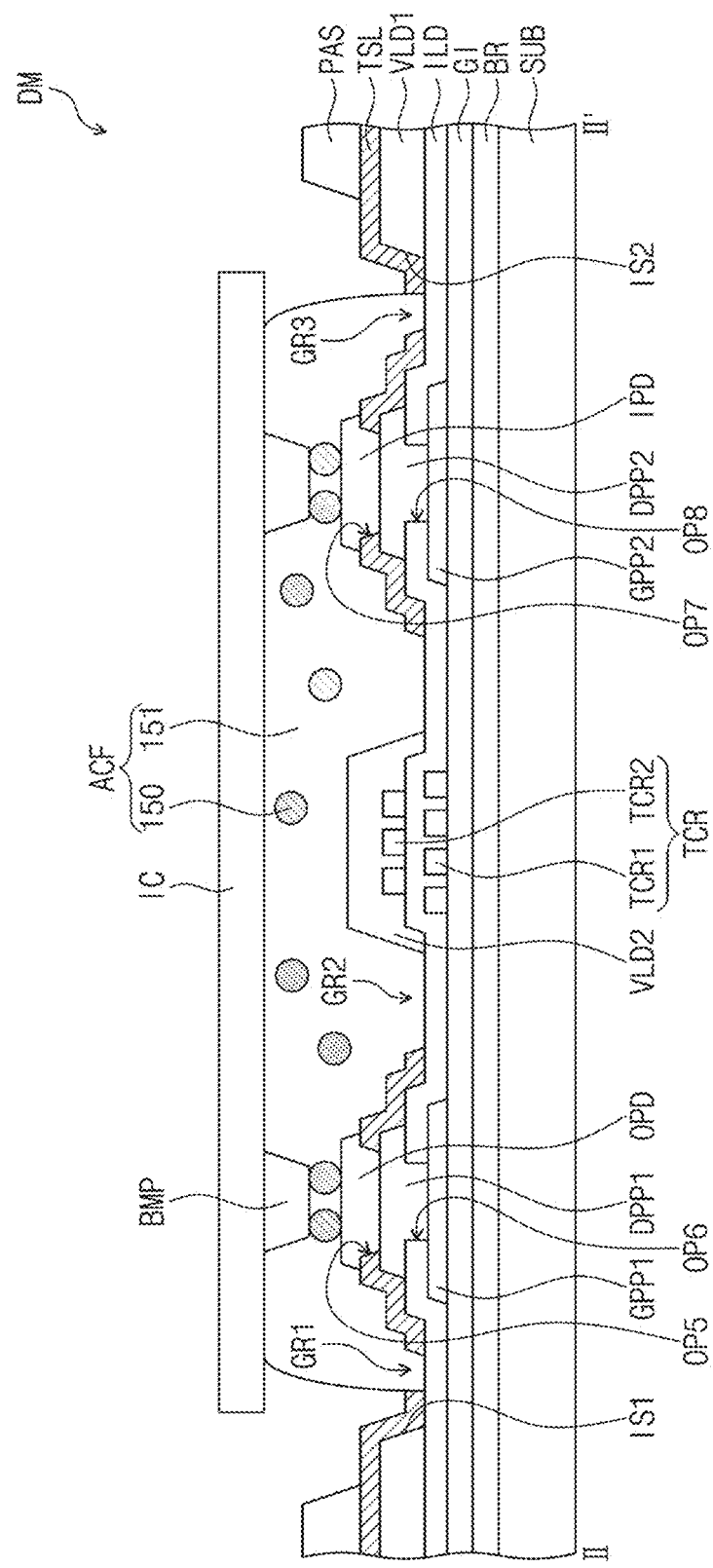
FIG. 9 is a cross-sectional view taken along line II-II' of FIG. 8.

FIG. 8 is an enlarged plan view illustrating a shape of an intaglio pattern, which is provided in the region 'AA' of FIG. 1, according to some exemplary embodiments of the invention, and FIG. 9 is a cross-sectional view taken along line II-II' of FIG. 8.

Referring to FIGS. 8 and 9, an intaglio pattern GR may be provided in the touch insulating layer TSL. The intaglio pattern GR may be a hole penetrating the touch insulating layer TSL. However, the invention is not limited thereto, and the intaglio pattern GR may penetrate the touch insulating layer TSL and partially define a recess in the interlayered insulating layer ILD.

The intaglio pattern GR may be overlapped with the non-display region NDA and may be provided near the pad group PDG (refer to FIG. 6) in a plan view. The intaglio pattern GR may be overlapped with the driving circuit chip IC in a plan view.

In a plan view, the intaglio pattern may be provided between the output pads and the intermediate insulating layer. That is, in a plan view, a distance between the intaglio pattern GR and the pad group PDG may be shorter than a distance between the pad group PDG and the intermediate insulating layer VLD. The shape of the intaglio pattern GR will be described in more detail below.

The intermediate insulating layer VLD may include a first intermediate insulating layer VLD1 and a second intermediate insulating layer VLD2.

The first intermediate insulating layer VLD1 may be spaced apart from the second intermediate insulating layer VLD2. In a plan view and in the second direction DR2, the second intermediate insulating layer VLD2 may be provided between the output pads OPD and the input pads IPD. The second intermediate insulating layer VLD2 may be overlapped with the driving circuit chip IC and cover the test circuit TCR. The first intermediate insulating layer VLD1 may be the remaining portion of the intermediate insulating layer VLD, except for the second intermediate insulating layer VLD2.

The first intermediate insulating layer VLD1 may define a fourth opening OP4, and the pad group PDG may be exposed through the fourth opening OP4. In a plan view, the fourth opening OP4 may have a rectangular shape, similar to that of the driving circuit chip IC. In an exemplary embodiment, the fourth opening OP4 may have first to fourth inner side surfaces, for example. As shown in FIG. 8, the fourth opening OP4 may include a first inner side surface IS1, which is positioned adjacent to the display region DA and extends in the first direction DR1, a second inner side surface IS2, which is parallel to the first inner side surface IS1, and a third inner side surface IS3 connecting the first and second inner side surfaces IS1 and IS2 to each other. Although a fourth inner side surface (not shown) is not shown in FIG. 8, the fourth inner side surface may face the third inner side surface IS3 and may connect the first and second inner side surfaces IS1 and IS2 to each other.

In some exemplary embodiments, the intaglio pattern GR may include first to third intaglio patterns GR1 to GR3.

The first intaglio pattern GR1 may extend between the output pads OPD and the first inner side surface IS1 of the first intermediate insulating layer VLD1.

The output pads OPD may be arranged to constitute first to third rows 101, 102, and 103, which are adjacent to the display region DA in order listed, and here, the first intaglio pattern GR1 may extend between the first row 101 of the output pads and the first inner side surface IS1 of the first intermediate insulating layer VLD1. The first intaglio pattern GR1 may have a line shape straightly extending in the first direction DR1.

The first intaglio pattern GR1 may expose the interlayered insulating layer ILD.

The second intaglio pattern GR2 may expose the second intermediate insulating layer VLD2 and the interlayered insulating layer ILD. In other words, the touch insulating layer TSL may not be overlapped with the second intermediate insulating layer VLD2. The output pads OPD and the input pads IPD may not be exposed by the second intaglio pattern GR2.

The third intaglio pattern GR3 may extend between the input pads IPD and the second inner side surface IS2 of the first intermediate insulating layer VLD1. The third intaglio pattern GR3 may have a line shape straightly extending in the first direction DR1.

FIG. 9 illustrates an example in which the first to third intaglio patterns GR1 to GR3 are provided through the touch insulating layer TSL, but the invention is not limited thereto. In an exemplary embodiment, the first to third intaglio patterns GR1 to GR3 may partially define a recess in the interlayered insulating layer ILD.

Referring to FIG. 9, the display apparatus DM may further include a bump BMP. The bump BMP may be attached to a surface of the driving circuit chip IC facing a display panel DP. The bump BMP may consist of or include a conductive material. The driving circuit chip IC may receive a voltage and a current signal through the bump BMP.

The driving circuit chip IC may be disposed (e.g., mounted) on the display panel DP by disposing an anisotropic conductive film ("ACF") between the driving circuit chip IC and the display panel DP and performing a thermo-compression process. The anisotropic conductive film ACF may include a plurality of conductive balls 150 and an adhesive material 151 enclosing the conductive ball 150. The conductive ball 150 may electrically connect the bump BMP to the input and output pads IPD and OPD.

As shown in FIG. 9, the output pad OPD may contact an output data pad pattern DPP1 through a fifth opening OP5 provided in the touch insulating layer TSL, and the output data pad pattern DPP1 may contact an output gate pad pattern GPP1 through a sixth opening OP6 provided in the interlayered insulating layer ILD.

The input pad IPD may contact an input data pad pattern DPP2 through a seventh opening OP7 provided in the touch insulating layer TSL, and the input data pad pattern DPP2 may contact an input gate pad pattern GPP2 through an eighth opening OP8 provided in the interlayered insulating layer ILD.

The output pad OPD and the input pad IPD may have substantially the same structure as that of FIG. 7, and a detailed description thereof will be omitted.

In FIG. 9, the test circuit TCR may include at least one of a first test pattern TCR1 and a second test pattern TCR2. The first test pattern TCR1 may be provided at the same level as that of the output gate pad pattern GPP1 and the input gate pad pattern GPP2. The second test pattern TCR2 may be provided at the same level as that of the output data pad pattern DPP1 and the input data pad pattern DPP2.

Figure 10:
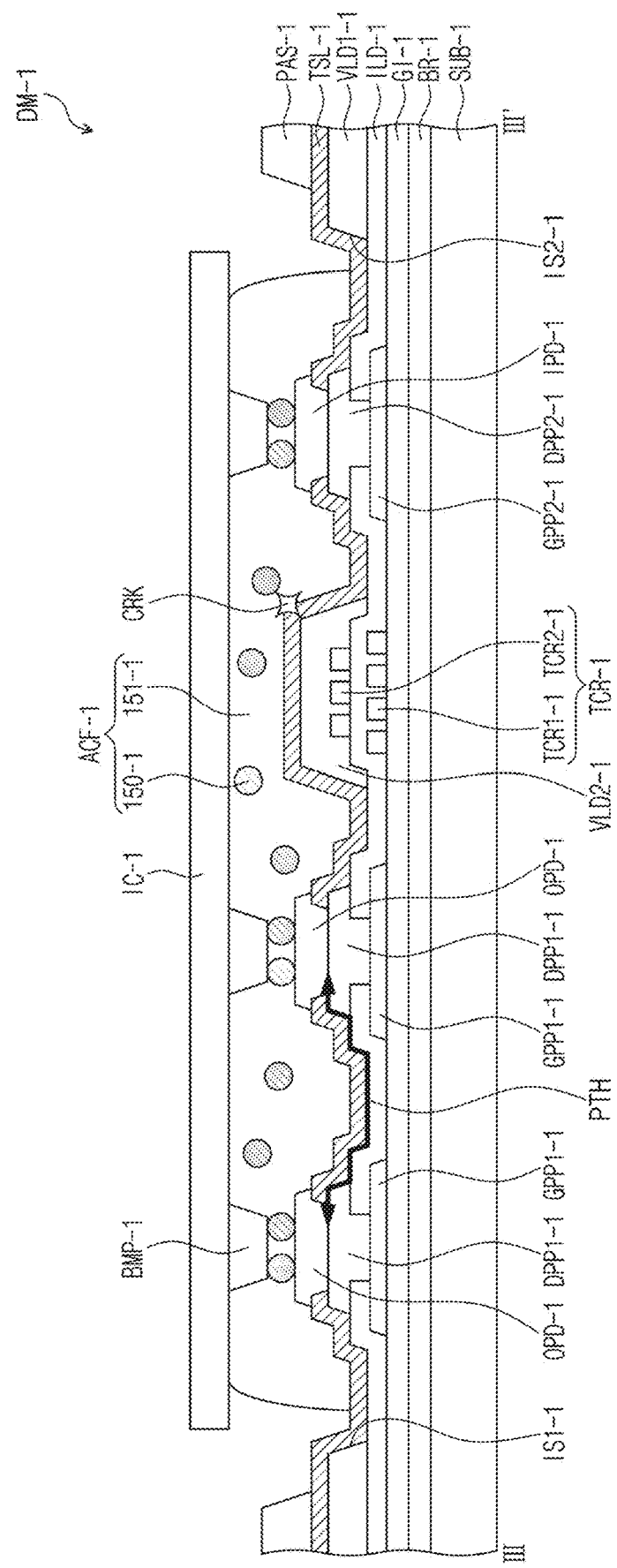
FIG. 10 is a cross-sectional view exemplarily illustrating a display apparatus according to a comparative example of the invention.
Figure 11:
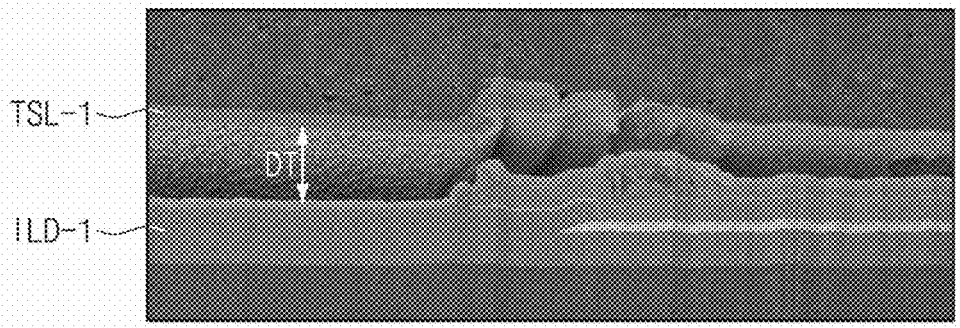
FIG. 11 is an image showing a vertical section of a display apparatus according to the comparative example.
Figure 12:
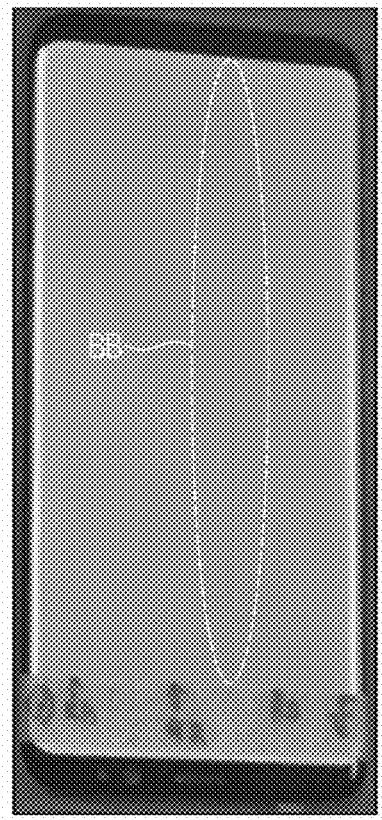
FIG. 12 is an image showing a failure occurred in a portable terminal including a display apparatus according to the comparative example.

FIG. 10 is a cross-sectional view exemplarily illustrating a display apparatus according to a comparative example of the invention, FIG. 11 is an image showing a vertical section of a display apparatus according to the comparative example, and FIG. 12 is an image showing a failure occurred in a portable terminal including a display apparatus according to the comparative example.

A display apparatus of FIG. 10 is assumed to have the same structure as that of FIG. 9, except for the intaglio pattern GR of FIG. 9. A cross-sectional view of FIG. 10 corresponds to line of FIG. 8. A reference number of each element in FIG. 10 is given in the form of adding "−1" to the reference number of a corresponding one of the display apparatus of FIG. 9.

Since both of an interlayered insulating layer ILD-1 and a touch insulating layer TSL-1 include an inorganic material, adhesion strength therebetween may be relatively weak. Thus, the touch insulating layer TSL-1 may be easily delaminated or detached from the interlayered insulating layer ILD-1.

In an exemplary embodiment, a crack CRK may occur in the touch insulating layer TSL-1, for example. The crack CRK may be produced by a variety of causes. The crack CRK in the touch insulating layer TSL-1 may be produced by pressure to be exerted on the touch insulating layer TSL-1 from a conductive ball 150-1 during a process of pressing a driving circuit chip IC-1, for example. In addition, when the flexible display panel DP is bent, the crack CRK may be produced in the touch insulating layer TSL-1.

Under high temperature and high humidity environment, an intermediate insulating layer VLD-1 including an organic material may absorb moisture through the crack CRK and may be thermally expanded, and in this case, the touch insulating layer TSL-1 may be delaminated or detached from the interlayered insulating layer ILD-1. FIG. 11 shows the touch insulating layer TSL-1 and the interlayered insulating layer ILD-1, which are separated from each other by a first distance DT.

In the case where a fluid path PTH is provided between the touch insulating layer TSL-1 and the interlayered insulating layer ILD-1, water molecules may be moved to adjacent pads through the fluid path PTH, thereby causing a short circuit between the pads. In particular, for a high resolution display panel DP, a distance between the output pads OPD may be very small, and thus, a short circuit may be easily provided between adjacent ones of the output pads OPD through the fluid path PTH. FIG. 10 illustrates an example of a short circuit provided between adjacent two output pads OPD.

If a short circuit is provided between adjacent ones of the output pads OPD, failure may occur in the form of a vertical line, as illustrated in a region 'BB' of FIG. 12. Depending on which combination between the input and output pads IPD and OPD causes the short circuit, the failure in a display apparatus DM-1 according to comparative example may occur in various forms, other than the vertical line failure shown in FIG. 12.

Referring back to FIGS. 8 and 9, the display apparatus DM may include the touch insulating layer TSL, in which the intaglio pattern GR is provided, and here, the intaglio pattern GR may prevent a delamination problem from occurring between the touch insulating layer TSL and the interlayered insulating layer ILD or prevent a delamination problem, which may occur between the touch insulating layer TSL and the interlayered insulating layer ILD, from being transferred toward the input pad IPD and the output pad OPD.

The intermediate insulating layer VLD may have a relatively large thickness, compared with any other layer provided below the intermediate insulating layer VLD, except for the substrate SUB. In an exemplary embodiment, the intermediate insulating layer VLD may have a thickness equal to or greater than about 10000 angstroms (Å), and all of the barrier layer BR, the active layer ACT, the gate insulating layer GI, the gate electrode GE, the interlayered insulating layer ILD, and the input and output electrodes SE and DE may have a thickness equal to or less than about 10000 Å, for example.

Since the intermediate insulating layer VLD has a relatively large thickness, portions of the touch insulating layer TSL, which are overlapped with the inner side surfaces (e.g., see IS1 to IS3) of the intermediate insulating layer VLD, may have a relatively small thickness, thereby being vulnerable to a crack. Furthermore, a portion of the touch insulating layer TSL overlapped with the driving circuit chip IC may be vulnerable to the crack, due to the pressure to be exerted on the conductive ball 150 in a process of pressing the driving circuit chip IC. In other words, the crack possibility of the touch insulating layer TSL may be high at a region that is overlapped with the intermediate insulating layer VLD. Although a crack in the touch insulating layer TSL, which occurs at a region overlapped with the intermediate insulating layer VLD, may lead to a delamination problem between the touch insulating layer TSL and the interlayered insulating layer ILD, but according to some exemplary embodiments of the invention, the intaglio pattern GR may be provided at a region capable of preventing such a delamination problem from being transferred toward the output pads OPD and the input pads IPD.

The first intaglio pattern GR1 may prevent a delamination problem, which may occur between the touch insulating layer TSL and the interlayered insulating layer ILD, from being transferred in the second direction DR2 or from the first inner side surface IS1 of the first intermediate insulating layer VLD1 toward the output pads OPD.

The second intaglio pattern GR2 may expose the second intermediate insulating layer VLD2, thereby preventing a crack from occurring near the second intermediate insulating layer VLD2.

The third intaglio pattern GR3 may prevent a delamination problem, which may occur between the touch insulating layer TSL and the interlayered insulating layer ILD, from being transferred in the second direction DR2 or from the second inner side surface IS2 of the first intermediate insulating layer VLD1 toward the input pads IPD.

In a display apparatus according to some exemplary embodiments of the invention, an intaglio pattern may be provided in a touch insulating layer, and the intaglio pattern may prevent a delamination problem, which may occur between the touch insulating layer TSL and the interlayered insulating layer ILD, causing a short circuit between the output pads OPD and the input pads IPD.

Figure 13:
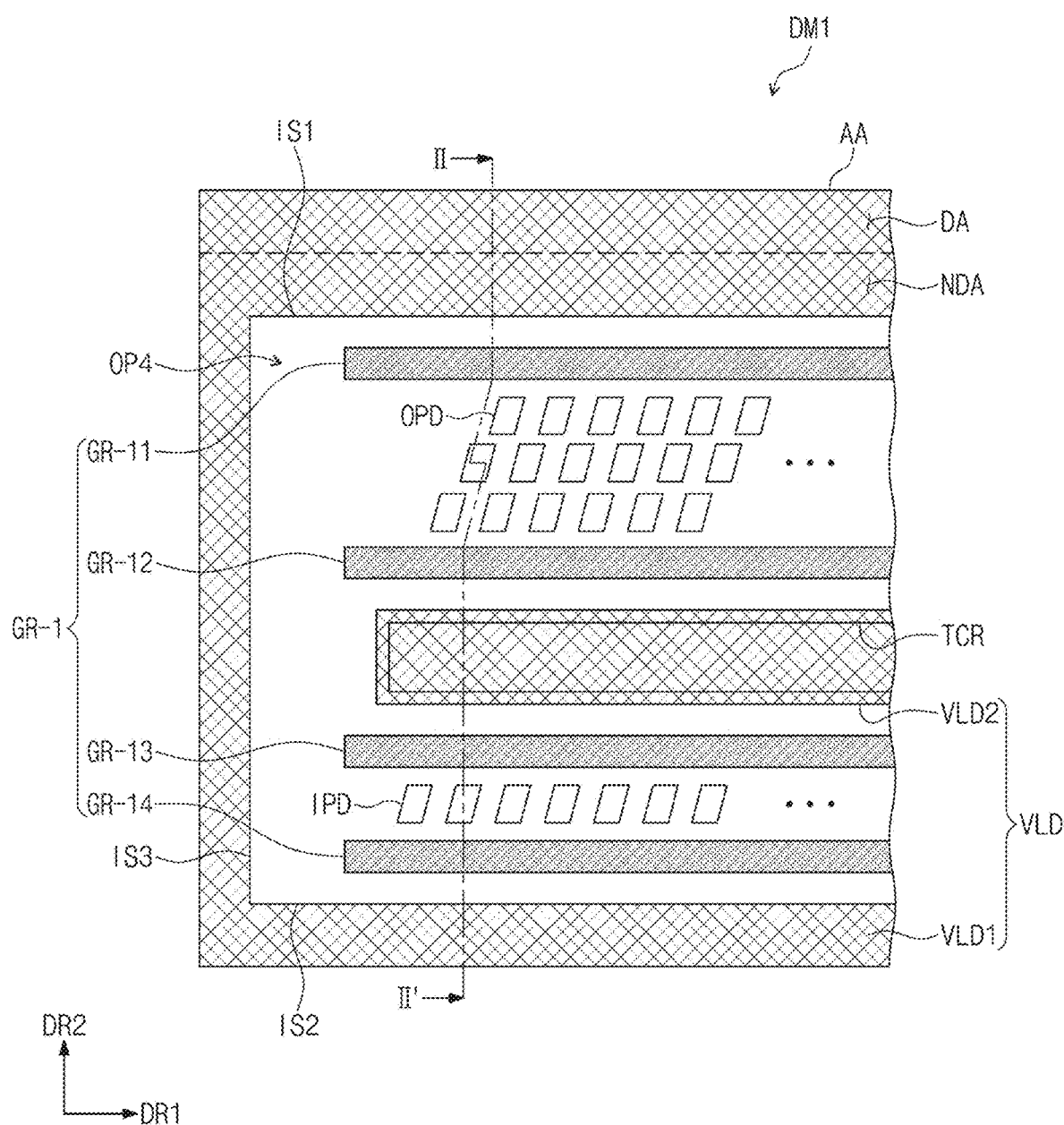
FIG. 13 is an enlarged plan view illustrating another exemplary embodiment of a shape of an intaglio pattern, which is provided in the region 'AA' of FIG. 1, according to the invention.
Figure 14:
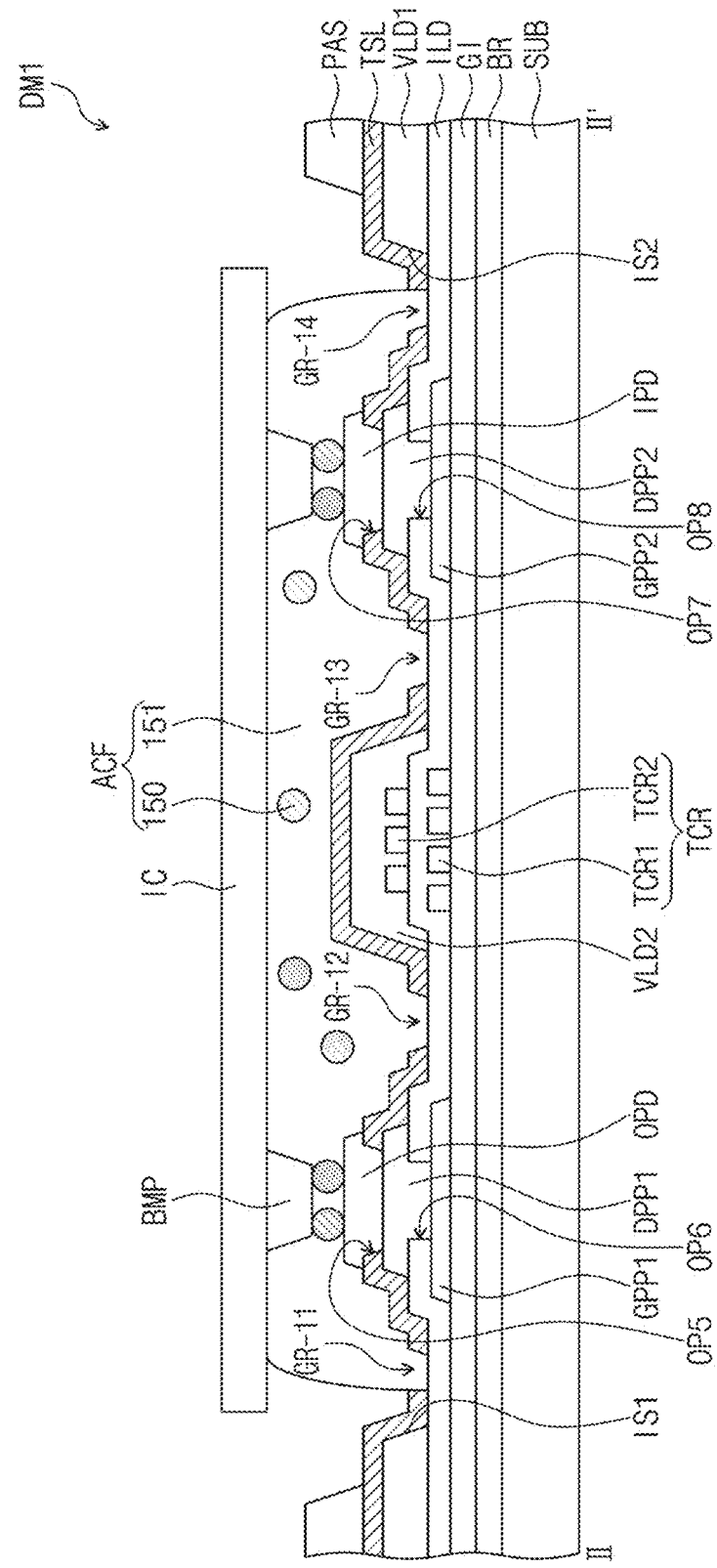
FIG. 14 is a cross-sectional view taken along line II-II' of FIG. 13.

FIG. 13 is an enlarged plan view illustrating a shape of an intaglio pattern, which is provided in the region 'AA' of FIG. 1, according to other exemplary embodiments of the invention, and FIG. 14 is a cross-sectional view taken along line II-II' of FIG. 13.

A display apparatus DM1 to be described with reference to FIGS. 13 and 14 may have substantially the same features as those of the display apparatus DM described with reference to FIGS. 8 and 9, except for a difference in shape of an intaglio pattern GR-1. Hereinafter, the shape of the intaglio pattern GR-1 will be described in more detail, and a detailed description of other elements will be omitted.

The intaglio pattern GR-1 may include first to fourth intaglio patterns GR-11 to GR-14.

The first to fourth intaglio patterns GR-11 to GR-14 may expose the interlayered insulating layer ILD.

The first intaglio pattern GR-11 may extend between the output pads OPD and the first inner side surface IS1 of the first intermediate insulating layer VLD1. The first intaglio pattern GR-11 may have a line shape straightly extending in the first direction DR1. The first intaglio pattern GR-11 may prevent a delamination problem, which may occur between the touch insulating layer TSL and the interlayered insulating layer ILD, from being transferred in the second direction DR2 or from the first inner side surface IS1 of the first intermediate insulating layer VLD1 toward the output pads OPD.

The second intaglio pattern GR-12 may extend between the second intermediate insulating layer VLD2 and the output pads OPD. The second intaglio pattern GR-12 may have a line shape straightly extending in the first direction DR1. The second intaglio pattern GR-12 may prevent a delamination problem, which may occur between the touch insulating layer TSL and the interlayered insulating layer ILD, from being transferred in the second direction DR2 or from the second intermediate insulating layer VLD2 toward the output pads OPD.

The third intaglio pattern GR-13 may extend between the second intermediate insulating layer VLD2 and the input pads IPD. The third intaglio pattern GR-13 may have a line shape straightly extending in the first direction DR1. The third intaglio pattern GR-13 may prevent a delamination problem, which may occur between the touch insulating layer TSL and the interlayered insulating layer ILD, from being transferred in the second direction DR2 or from the second intermediate insulating layer VLD2 toward the input pads IPD.

The fourth intaglio pattern GR-14 may extend between the input pads IPD and the second inner side surface IS2 of the first intermediate insulating layer VLD1. The fourth intaglio pattern GR-14 may have a line shape straightly extending in the first direction DR1. The fourth intaglio pattern GR-14 may prevent a delamination problem, which may occur between the touch insulating layer TSL and the interlayered insulating layer ILD, from being transferred in the second direction DR2 or from the second inner side surface IS2 of the first intermediate insulating layer VLD1 toward the input pads IPD.

Figure 15:
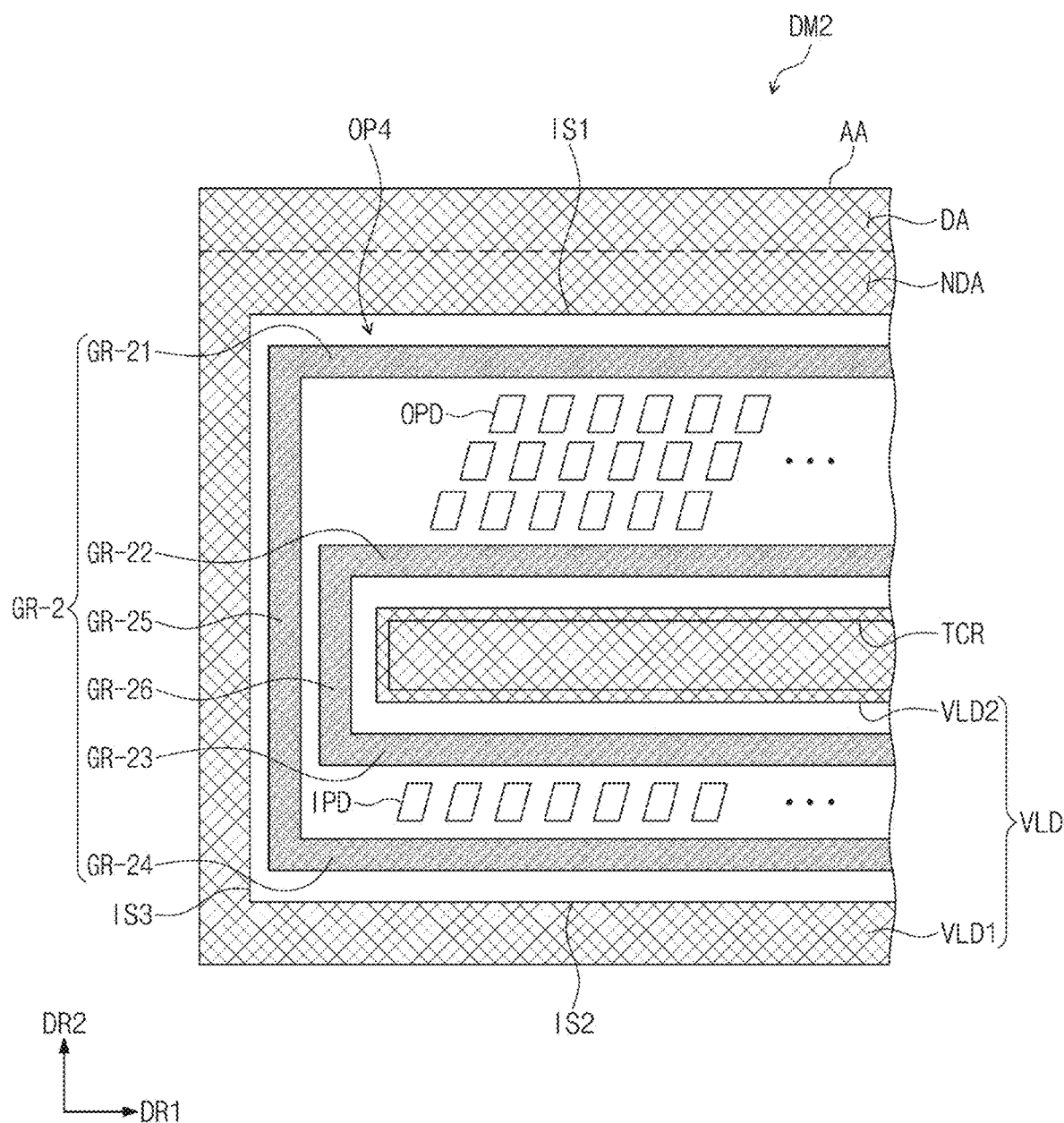
FIG. 15 is an enlarged plan view illustrating another exemplary embodiment of a shape of an intaglio pattern, which is provided in the region 'AA' of FIG. 1, according to the invention.

FIG. 15 is an enlarged plan view illustrating a shape of an intaglio pattern, which is provided in the region 'AA' of FIG. 1, according to other exemplary embodiments of the invention.

A display apparatus DM2 to be described with reference to FIG. 15 may have substantially the same features as those of the display apparatus DM1 described with reference to FIGS. 13 and 14, except for a difference associated with an intaglio pattern GR-2. Thus, the shape of the intaglio pattern GR-2 will be described in more detail below, and a detailed description of other elements will be omitted in order to avoid redundancy.

The intaglio pattern GR-2 may include first to sixth intaglio patterns GR-21 to GR-26.

The first to fourth intaglio patterns GR-21 to GR-24 may have substantially the same features as those of the first to fourth intaglio patterns GR-11 to GR-14 described with reference to FIG. 13, and a detailed description thereof will be omitted.

The fifth intaglio pattern GR-25 may extend in the second direction DR2 and along a region adjacent to the third inner side surface IS3 of the first intermediate insulating layer VLD1. The fifth intaglio pattern GR-25 may connect the first intaglio pattern GR-21 to the fourth intaglio pattern GR-24. However, the invention is not limited thereto, and the fifth intaglio pattern GR-25 may not have a straight line shape but include a plurality of patterns, which are spaced apart from each other in the second direction DR2, in consideration of the arrangement of underlying interconnection lines. The fifth intaglio pattern GR-25 may prevent a delamination problem, which may occur between the touch insulating layer TSL and the interlayered insulating layer ILD, from being transferred in the first direction DR1 or from the first intermediate insulating layer VLD1 toward the output pads OPD and the input pads IPD.

The sixth intaglio pattern GR-26 may extend in the second direction DR2 and along a region adjacent to the third inner side surface IS3 of the first intermediate insulating layer VLD1. The sixth intaglio pattern GR-26 may connect the second intaglio pattern GR-22 to the third intaglio pattern GR-23. However, the invention is not limited thereto, and the sixth intaglio pattern GR-26 may include a plurality of patterns, which are spaced apart from each other in the second direction DR2, in consideration of the arrangement of underlying interconnection lines.

Although not shown, the intaglio pattern GR-2 may further include a seventh intaglio pattern (not shown) and an eighth intaglio pattern (not shown).

The seventh intaglio pattern (not shown) may extend in the second direction DR2 and along a region adjacent to a fourth inner side surface (not shown) of the first intermediate insulating layer VLD1. The seventh intaglio pattern (not shown) may connect the first intaglio pattern GR-21 to the fourth intaglio pattern GR-24.

The eighth intaglio pattern (not shown) may extend in the second direction DR2 and along a region adjacent to the fourth inner side surface (not shown) of the first intermediate insulating layer VLD1. The eighth intaglio pattern (not shown) may connect the second intaglio pattern GR-22 to the third intaglio pattern GR-23.

Figure 16:
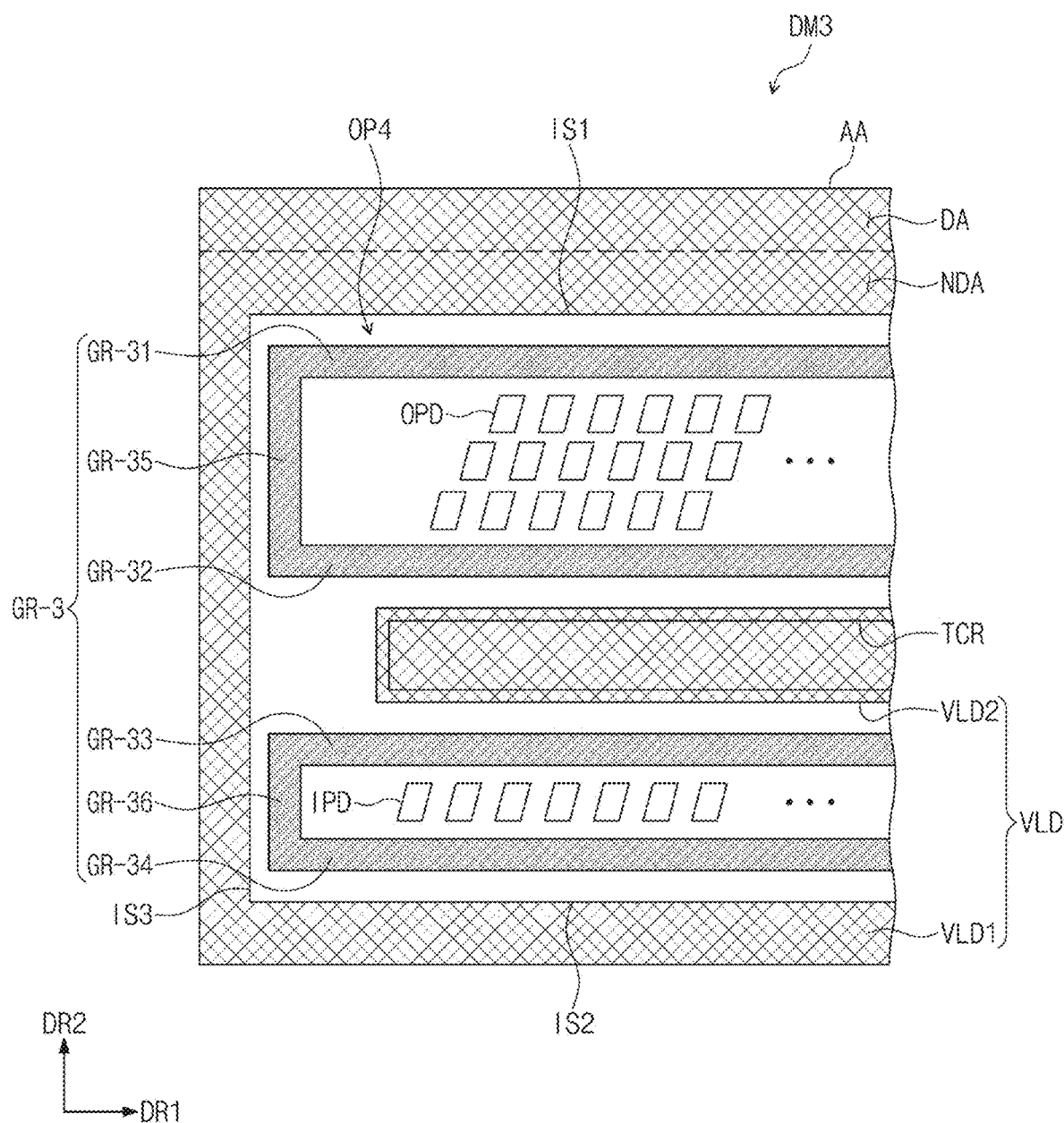
FIG. 16 is an enlarged plan view illustrating another exemplary embodiment of a shape of an intaglio pattern, which is provided in the region 'AA' of FIG. 1, according to the invention.

FIG. 16 is an enlarged plan view illustrating a shape of an intaglio pattern, which is provided in the region 'AA' of FIG. 1, according to other exemplary embodiments of the invention.

A display apparatus DM3 to be described with reference to FIG. 16 may have substantially the same features as those of the display apparatus DM1 described with reference to FIGS. 13 and 14, except for a difference associated with an intaglio pattern GR-3. Thus, the shape of the intaglio pattern GR-3 will be described in more detail below, and a detailed description of other elements will be omitted in order to avoid redundancy.

The intaglio pattern GR-3 may include first to sixth intaglio patterns GR-31 to GR-36.

The first to fourth intaglio patterns GR-31 to GR-34 may have substantially the same features as those of the first to fourth intaglio patterns GR-21 to GR-24 described with reference to FIG. 13, and a detailed description thereof will be omitted.

The fifth intaglio pattern GR-35 may extend in the second direction DR2 and along a region adjacent to the third inner side surface IS3 of the first intermediate insulating layer VLD1. The fifth intaglio pattern GR-35 may connect the first intaglio pattern GR-31 to the second intaglio pattern GR-32. However, the invention is not limited thereto, and the fifth intaglio pattern GR-35 may not have a straight line shape but include a plurality of patterns, which are spaced apart from each other in the second direction DR2, in consideration of the arrangement of underlying interconnection lines. The fifth intaglio pattern GR-35 may prevent a delamination problem, which may occur between the touch insulating layer TSL and the interlayered insulating layer ILD, from being transferred in the first direction DR1 from the first intermediate insulating layer VLD1 toward the output pads OPD.

The sixth intaglio pattern GR-36 may extend in the second direction DR2 and along a region adjacent to the third inner side surface IS3 of the first intermediate insulating layer VLD1. The sixth intaglio pattern GR-36 may connect the third intaglio pattern GR-33 to the fourth intaglio pattern GR-34. However, the invention is not limited thereto, and the sixth intaglio pattern GR-36 may include a plurality of patterns, which are spaced apart from each other in the second direction DR2, in consideration of the arrangement of underlying interconnection lines. The sixth intaglio pattern GR-36 may prevent a delamination problem, which may occur between the touch insulating layer TSL and the interlayered insulating layer ILD, from being transferred in the first direction DR1 or from the first intermediate insulating layer VLD1 toward the input pads IPD.

Although not shown, the intaglio pattern GR-3 may further include a seventh intaglio pattern (not shown) and an eighth intaglio pattern (not shown).

The seventh intaglio pattern (not shown) may extend in the second direction DR2 and along a region adjacent to the fourth inner side surface (not shown) of the first intermediate insulating layer VLD1. The seventh intaglio pattern (not shown) may connect the first intaglio pattern GR-31 to the second intaglio pattern GR-32.

The eighth intaglio pattern (not shown) may extend in the second direction DR2 and along a region adjacent to the fourth inner side surface (not shown) of the first intermediate insulating layer VLD1. The eighth intaglio pattern (not shown) may connect the third intaglio pattern GR-33 to the fourth intaglio pattern GR-34.

Figure 17:
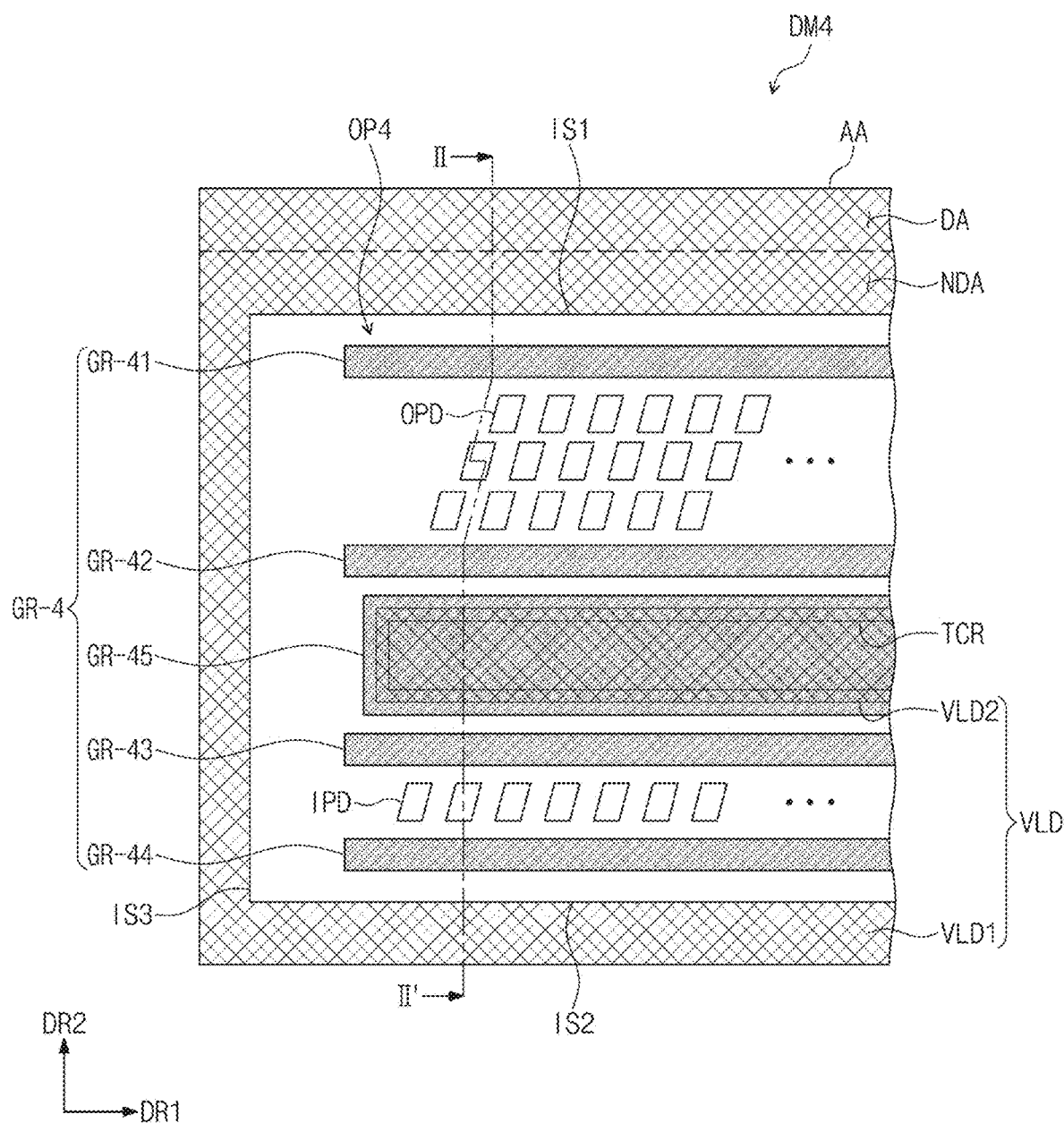
FIG. 17 is an enlarged plan view illustrating another exemplary embodiment of a shape of an intaglio pattern, which is provided in the region 'AA' of FIG. 1, according to the invention.
Figure 18:
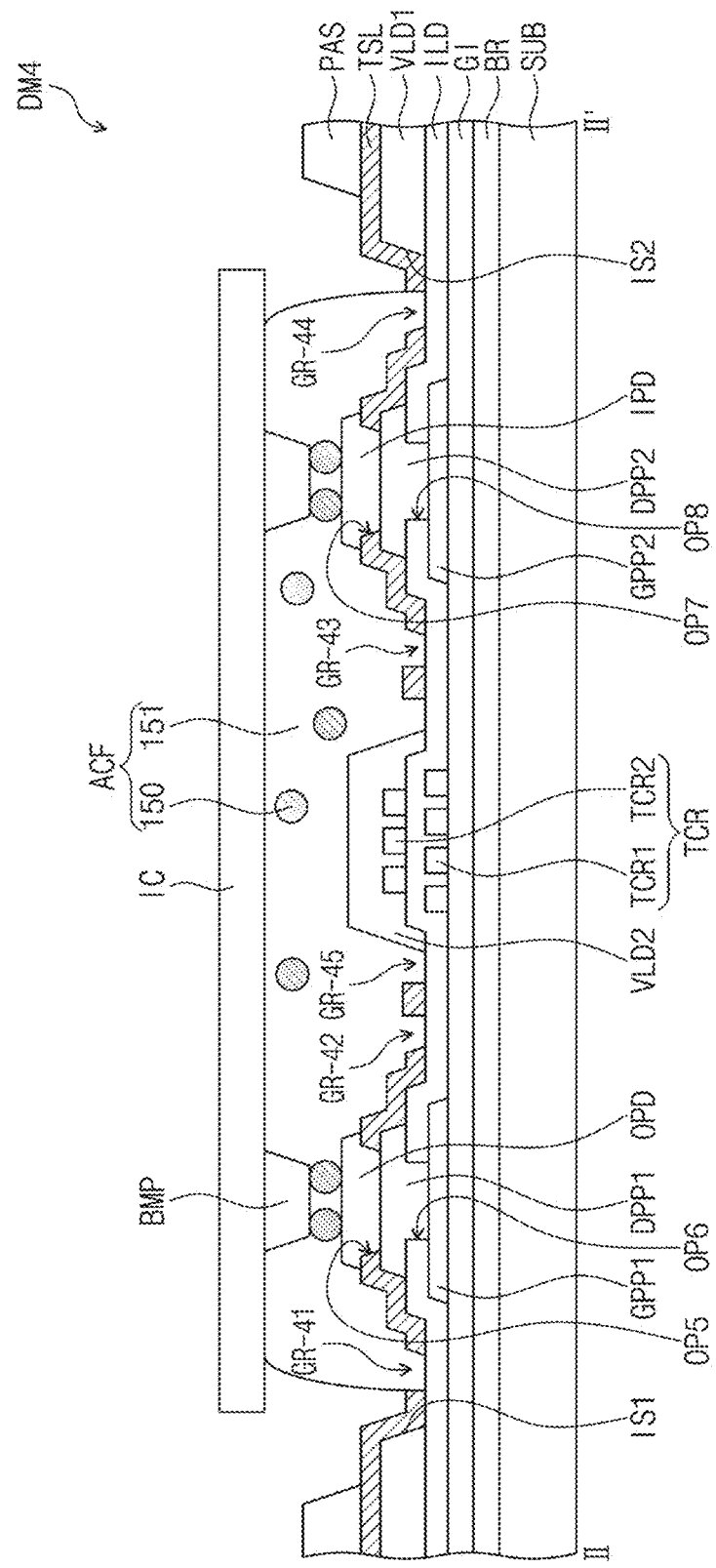
FIG. 18 is a cross-sectional view taken along line II-II' of FIG. 17.

FIG. 17 is an enlarged plan view illustrating a shape of an intaglio pattern, which is provided in the region 'AA' of FIG. 1, according to other exemplary embodiments of the invention, and FIG. 18 is a cross-sectional view taken along line II-II' of FIG. 17.

In a display apparatus DM4 according to other exemplary embodiments of the invention, an intaglio pattern GR-4 may include first to fifth intaglio patterns GR-41 to GR-45.

The first to fourth intaglio patterns GR-41 to GR-44 may have substantially the same features as those of the first to fourth intaglio patterns GR-11 to GR-14 described with reference to FIGS. 13 and 14.

The fifth intaglio pattern GR-45 may have substantially the same features as those of the second intaglio pattern GR2 described with reference to FIGS. 8 and 9.

The second intaglio pattern GR-42 may be spaced apart from the fifth intaglio pattern GR-45, and the third intaglio pattern GR-43 may be spaced apart from the fifth intaglio pattern GR-45.

Figure 19:
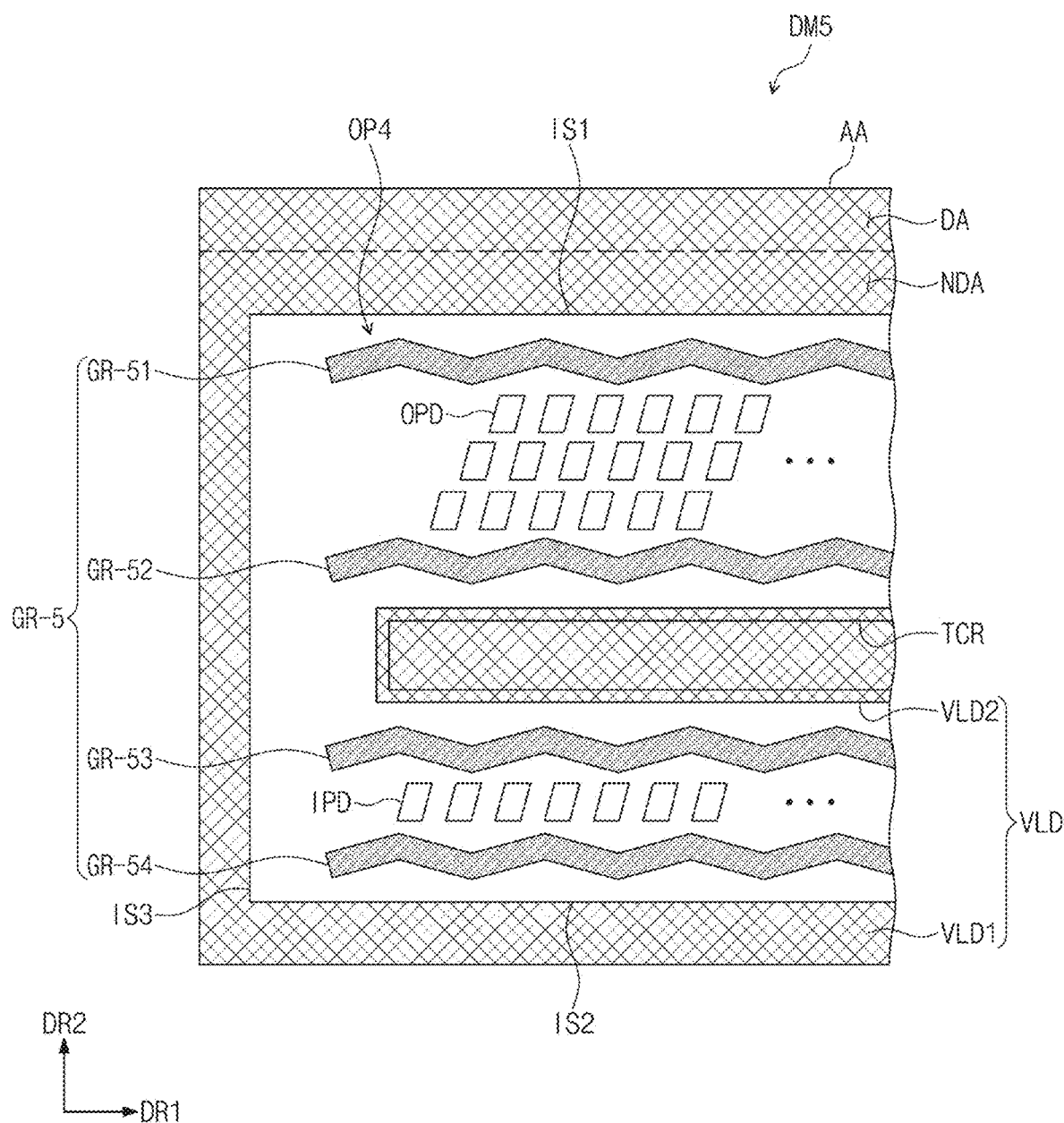
FIG. 19 is an enlarged plan view illustrating another exemplary embodiment of a shape of an intaglio pattern, which is provided in the region 'AA' of FIG. 1, according to the invention.

FIG. 19 is an enlarged plan view illustrating a shape of an intaglio pattern, which is provided in the region 'AA' of FIG. 1, according to other exemplary embodiments of the invention.

A display apparatus DM5 to be described with reference to FIG. 19 may have substantially the same features as those of the display apparatus DM1 described with reference to FIGS. 13 and 14, except for a difference associated with an intaglio pattern GR-5. Thus, the shape of the intaglio pattern GR-5 will be described in more detail below, and a detailed description of other elements will be omitted in order to avoid redundancy.

The intaglio pattern GR-5 may include first to fourth intaglio patterns GR-51 to GR-54.

Each of the first to fourth intaglio patterns GR-51 to GR-54 may have a zigzag shape extending in the first direction DR1. Each of the first to fourth intaglio patterns GR-51 to GR-54 may include a plurality of linear patterns which are connected to each other in at least two different directions. However, the invention is not limited thereto, and each of the first to fourth intaglio patterns GR-51 to GR-54 may include a plurality of curved patterns which are connected to each other.

Figure 20:
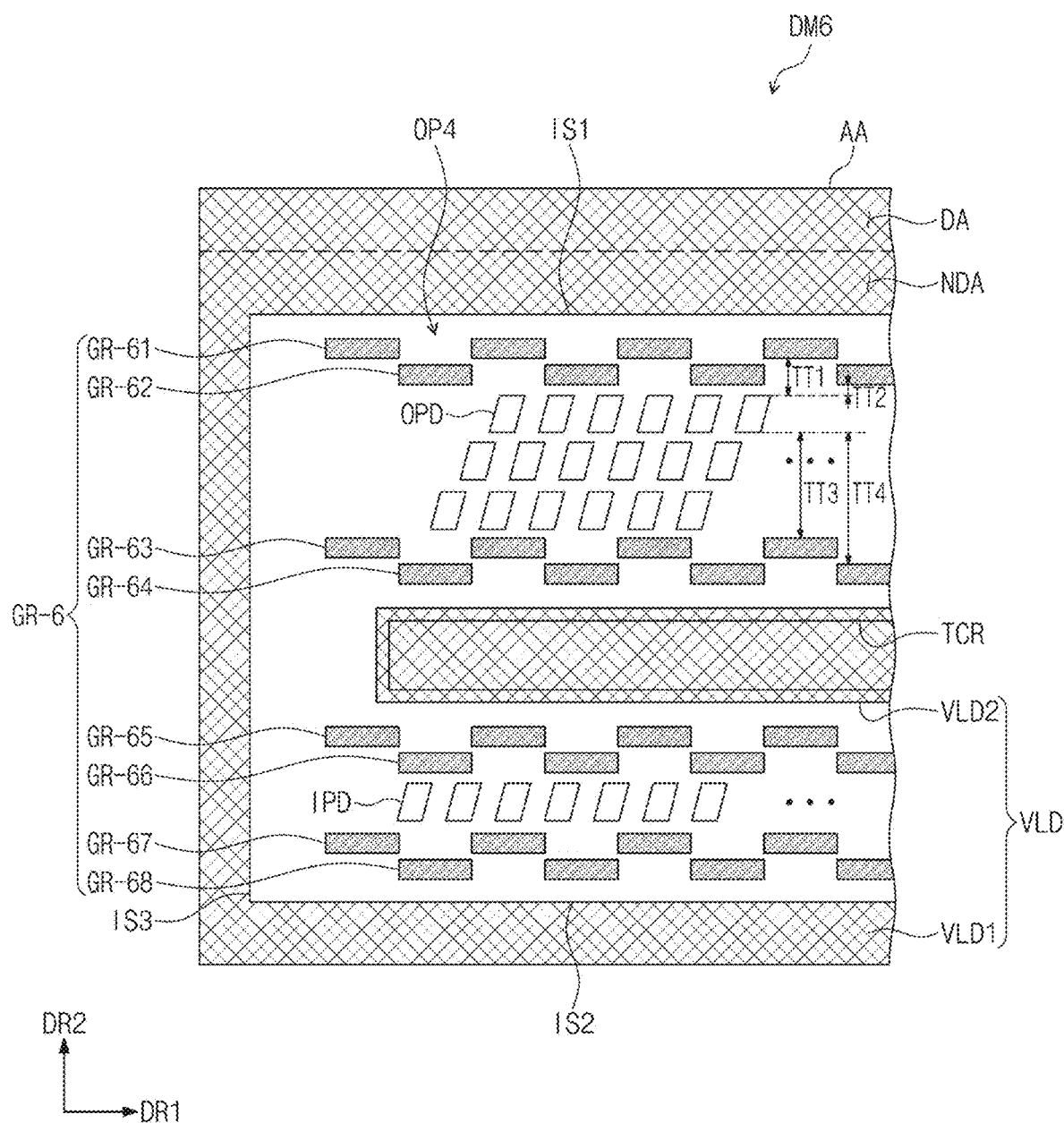
FIG. 20 is an enlarged plan view illustrating another exemplary embodiment of a shape of an intaglio pattern, which is provided in the region 'AA' of FIG. 1, according to the invention.

FIG. 20 is an enlarged plan view illustrating a shape of an intaglio pattern, which is provided in the region 'AA' of FIG. 1, according to other exemplary embodiments of the invention.

A display apparatus DM6 to be described with reference to FIG. 20 may have substantially the same features as those of the display apparatus DM1 described with reference to FIGS. 13 and 14, except for a difference associated with an intaglio pattern GR-6. Thus, the shape of the intaglio pattern GR-6 will be described in more detail below, and a detailed description of other elements will be omitted in order to avoid redundancy.

The intaglio pattern GR-6 may include first to eighth intaglio patterns GR-61 to GR-68. Each of the first to eighth intaglio patterns GR-61 to GR-68 may be provided in plural.

The first and second intaglio patterns GR-61 and GR-62 may be provided between the output pads OPD and the first inner side surface IS1 of the first intermediate insulating layer VLD1. The first intaglio patterns GR-61 may be spaced apart from each other in the first direction DR1. The second intaglio patterns GR-62 may be spaced apart from each other in the first direction DR1.

When measured in the second direction DR2 from the output pads OPD that are most adjacent to the display region DA, the first intaglio patterns GR-61 and the second intaglio patterns GR-62 may be arranged in two different regions having different distances. As shown in FIG. 20, the first intaglio pattern GR-61 may be spaced apart from the output pads OPD, which are most adjacent to the display region DA, by a first distance TT1, and the second intaglio pattern GR-62 may be spaced apart from the output pads OPD, which are most adjacent to the display region DA, by a second distance TT2 different from the first distance TT1.

The first intaglio patterns GR-61 may be provided between the second intaglio patterns GR-62, in the first direction DR1.

The third and fourth intaglio patterns GR-63 and GR-64 may be provided between the second intermediate insulating layer VLD2 and the output pads OPD. The third intaglio patterns GR-63 may be spaced apart from each other in the first direction DR1. The fourth intaglio patterns GR-64 may be spaced apart from each other in the first direction DR1.

When measured in the second direction DR2 from the output pads OPD that are most adjacent to the display region DA, the third intaglio patterns GR-63 and the fourth intaglio patterns GR-64 may be arranged in two different regions having different distances. As shown in FIG. 20, the third intaglio pattern GR-63 may be spaced apart from the output pads OPD, which are most adjacent to the display region DA, by a third distance TT3, and the fourth intaglio pattern GR-64 may be spaced apart from the output pads OPD, which are most adjacent to the display region DA, by a fourth distance TT4 different from the third distance TT3.

The third intaglio patterns GR-63 may be provided between the fourth intaglio patterns GR-64.

The fifth and sixth intaglio patterns GR-65 and GR-66 may be provided between the second intermediate insulating layer VLD2 and the input pads IPD.

The fifth and sixth intaglio patterns GR-65 and GR-66 may have shapes similar to those of the third and fourth intaglio patterns GR-63 and GR-64, and thus, a detailed description thereof will be omitted.

The seventh and eighth intaglio patterns GR-67 and GR-68 may be provided between the input pads IPD and the second inner side surface IS2 of the first intermediate insulating layer VLD1.

The seventh and eighth intaglio patterns GR-67 and GR-68 may have shapes similar to those of the first and second intaglio patterns GR-61 and GR-62, and thus, a detailed description thereof will be omitted.

Figure 21:
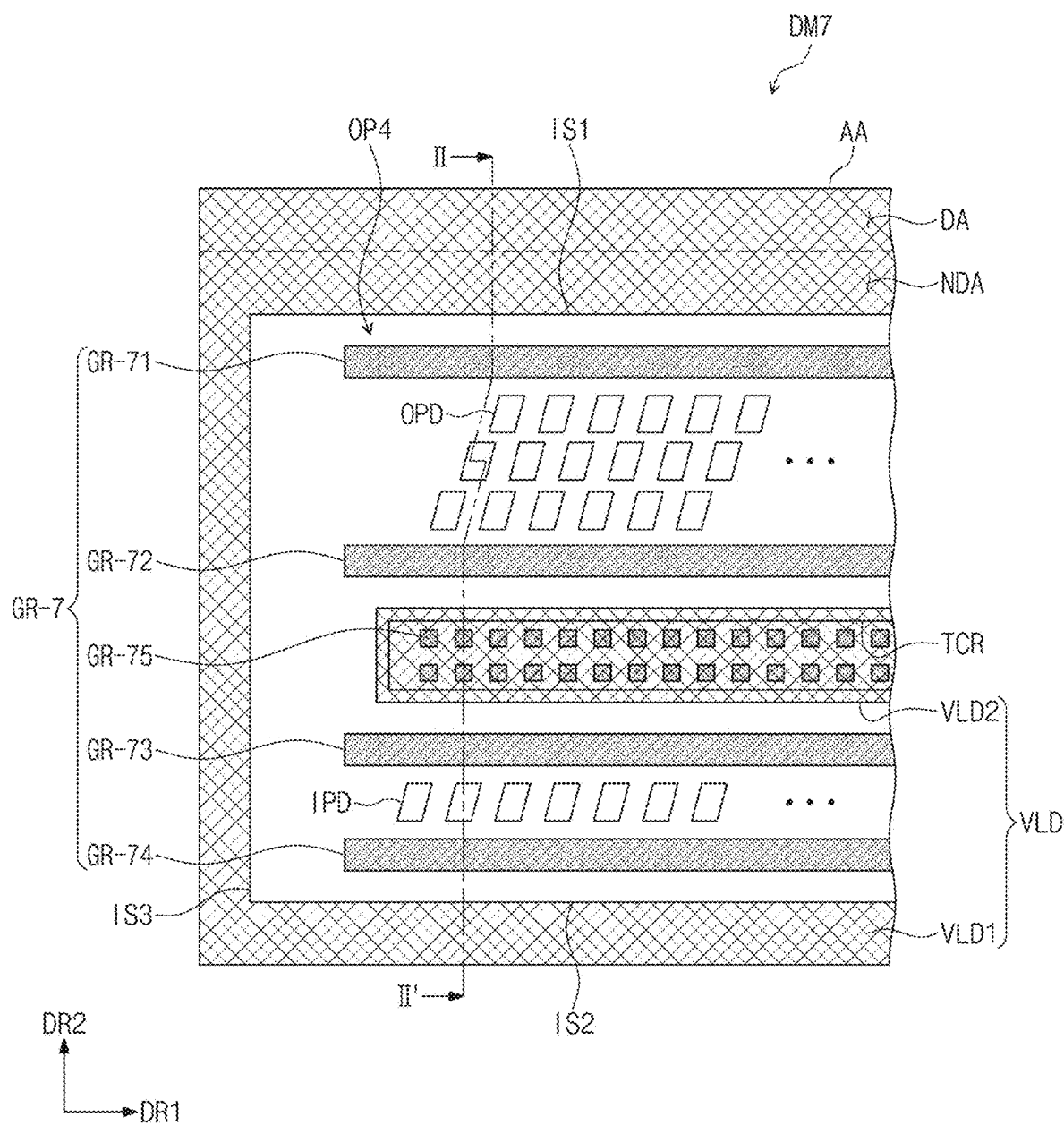
FIG. 21 is an enlarged plan view illustrating another exemplary embodiment of a shape of an intaglio pattern, which is provided in the region 'AA' of FIG. 1, according to the invention.
Figure 22:
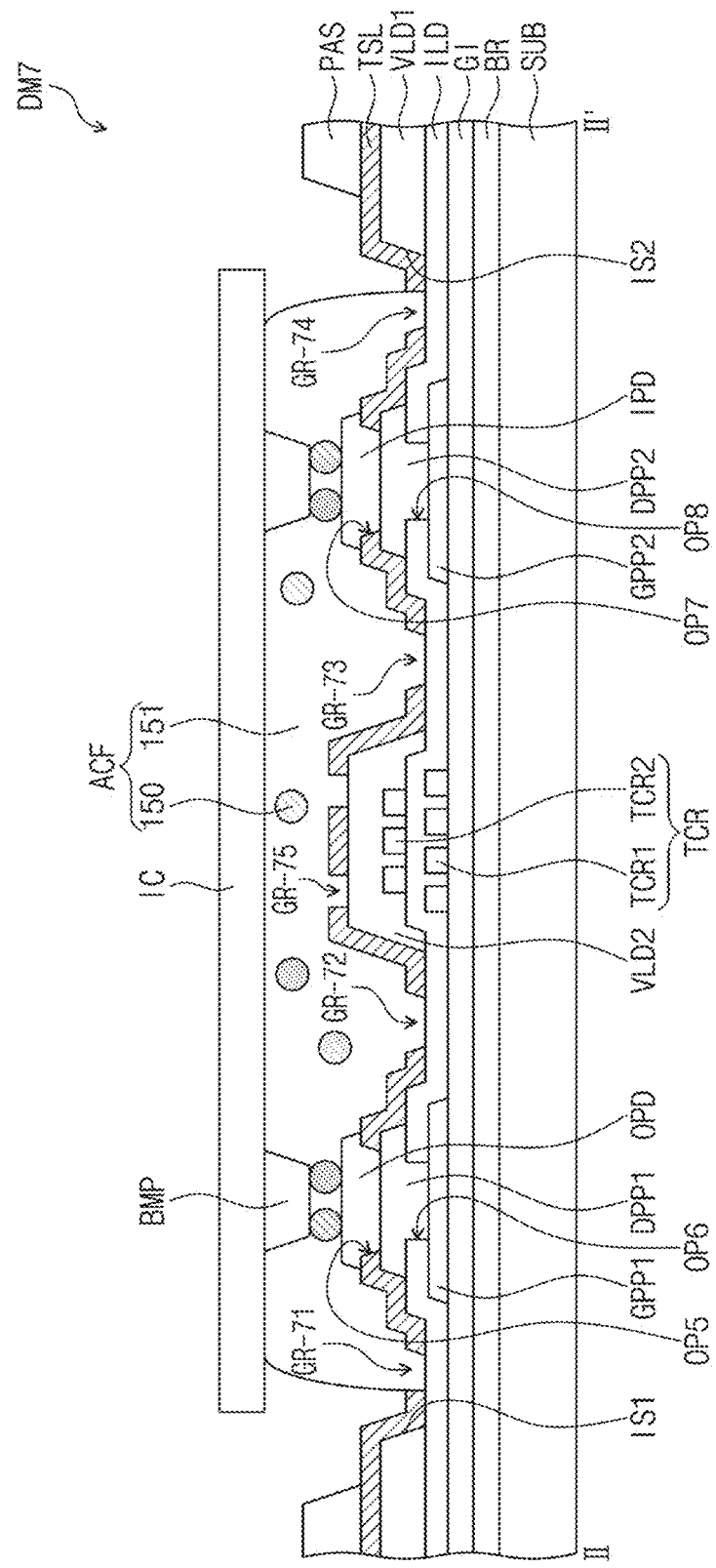
FIG. 22 is a cross-sectional view taken along line II-II' of FIG. 21.

FIG. 21 is an enlarged plan view illustrating a shape of an intaglio pattern, which is provided in the region 'AA' of FIG. 1, according to other exemplary embodiments of the invention, and FIG. 22 is a cross-sectional view taken along line II-II' of FIG. 21.

A display apparatus DM7 to be described with reference to FIG. 21 may have substantially the same features as those of the display apparatus DM1 described with reference to FIGS. 13 and 14, except for a difference associated with an intaglio pattern GR-7. Thus, the shape of the intaglio pattern GR-7 will be described in more detail below, and a detailed description of other elements will be omitted in order to avoid redundancy.

The intaglio pattern GR-7 may include first to fifth intaglio patterns GR-71 to GR-75.

The first to fourth intaglio patterns GR-71 to GR-74 may have substantially the same features as those of the first to fourth intaglio patterns GR-11 to GR-14 described with reference to FIG. 13.

The fifth intaglio patterns GR-75 may be provided in plural. In an exemplary embodiment, a plurality of fifth intaglio patterns GR-75 may be overlapped with the second intermediate insulating layer VLD2, for example. The plurality of fifth intaglio patterns GR-75 may partially expose the second intermediate insulating layer VLD2. The plurality of fifth intaglio patterns GR-75 may prevent a delamination problem between the touch insulating layer TSL and the interlayered insulating layer ILD, which may occur in the touch insulating layer TSL overlapped with the second intermediate insulating layer VLD2, from being transferred toward a neighboring region.

Figure 23:
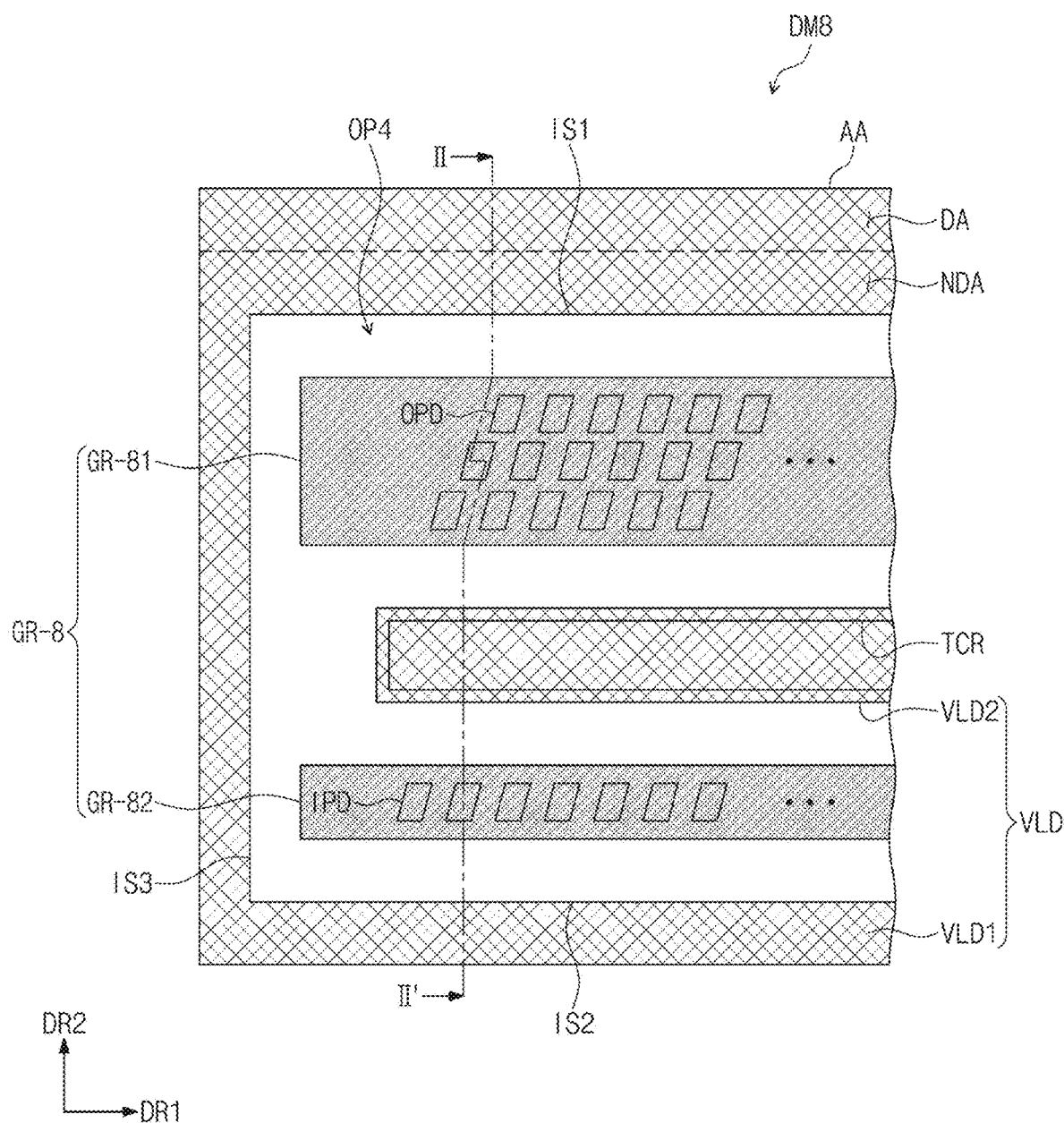
FIG. 23 is an enlarged plan view illustrating another exemplary embodiment of a shape of an intaglio pattern, which is provided in the region 'AA' of FIG. 1, according to the invention.
Figure 24:
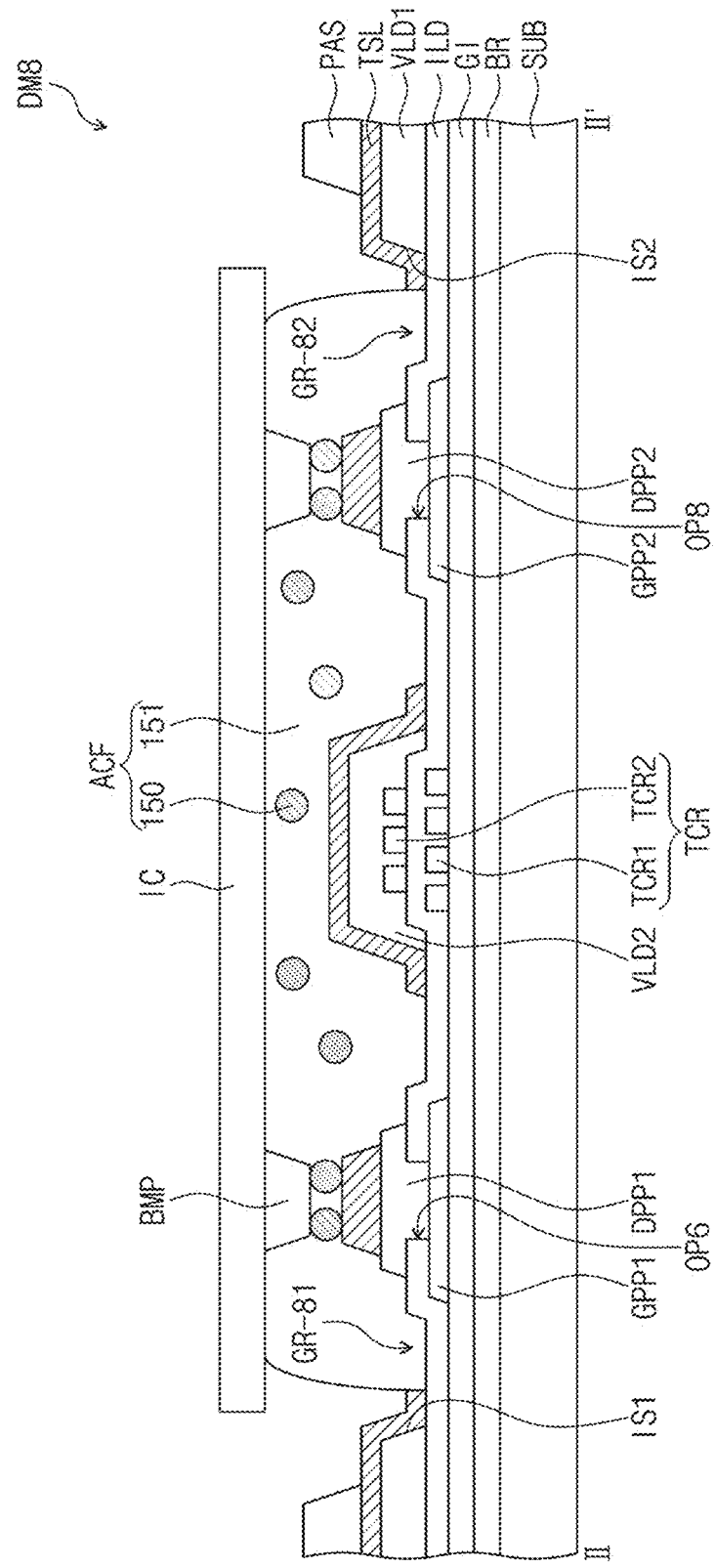
FIG. 24 is a cross-sectional view taken along line II-II' of FIG. 23.

FIG. 23 is an enlarged plan view illustrating a shape of an intaglio pattern, which is provided in the region 'AA' of FIG. 1, according to other exemplary embodiments of the invention, and FIG. 24 is a cross-sectional view taken along line II-II' of FIG. 23.

In a display apparatus DM8 shown in FIG. 23, an intaglio pattern GR-8 may include first and second intaglio patterns GR-81 and GR-82.

The first intaglio pattern GR-81 may be overlapped with the output pads OPD. In a plan view, the first intaglio pattern GR-81 may cover all of the output pads OPD. The first intaglio pattern GR-81 may prevent a delamination problem, which may occur between the touch insulating layer TSL and the interlayered insulating layer ILD, from being transferred toward the output pads OPD.

The second intaglio pattern GR-82 may be overlapped with the input pads IPD. In a plan view, the second intaglio pattern GR-82 may cover all of the input pads IPD. The second intaglio pattern GR-82 may prevent a delamination problem, which may occur between the touch insulating layer TSL and the interlayered insulating layer ILD, from being transferred toward the input pads IPD.

Figure 25:
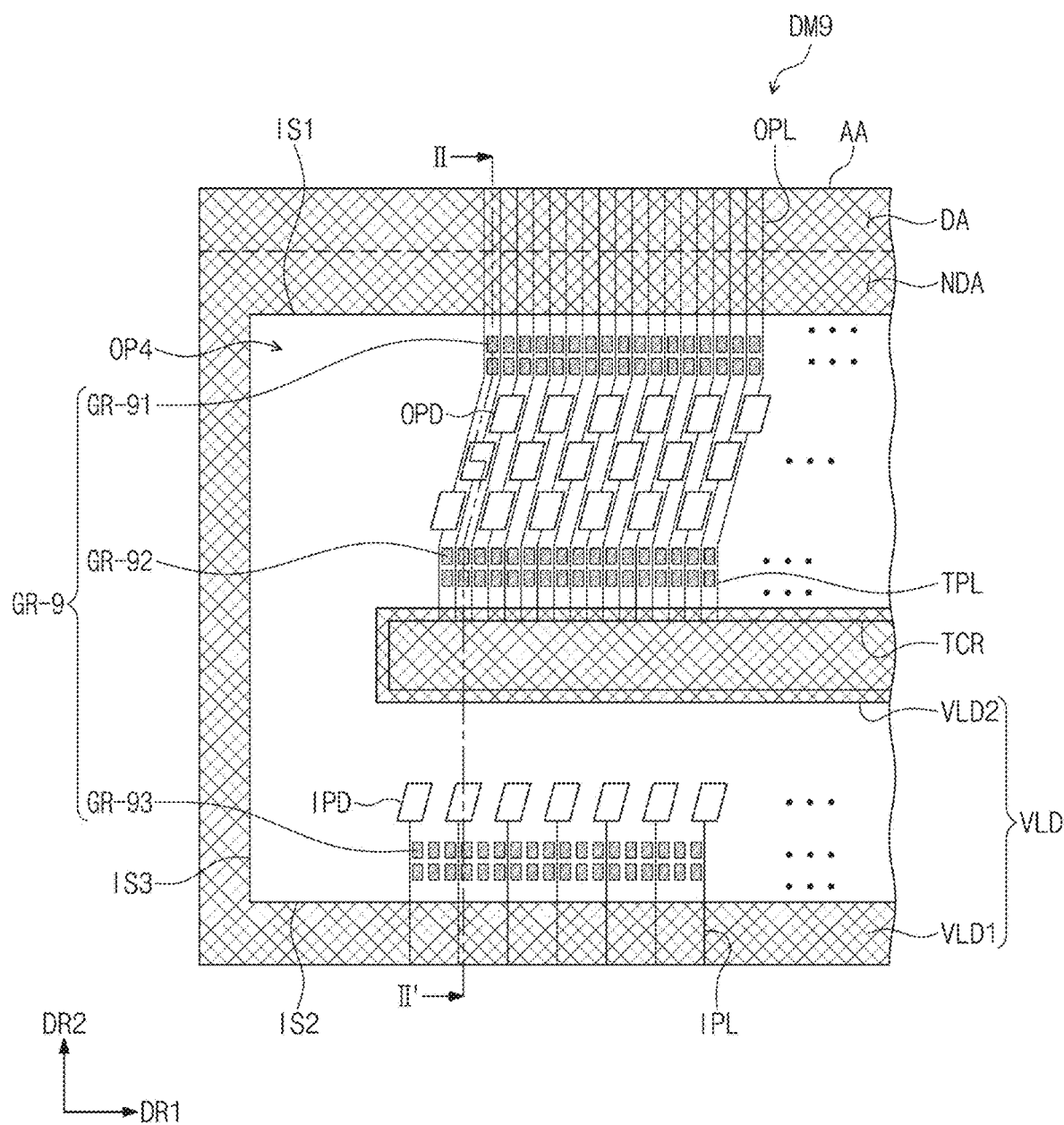
FIG. 25 is an enlarged plan view illustrating another exemplary embodiment of a shape of an intaglio pattern, which is provided in the region 'AA' of FIG. 1, according to the invention.
Figure 26:
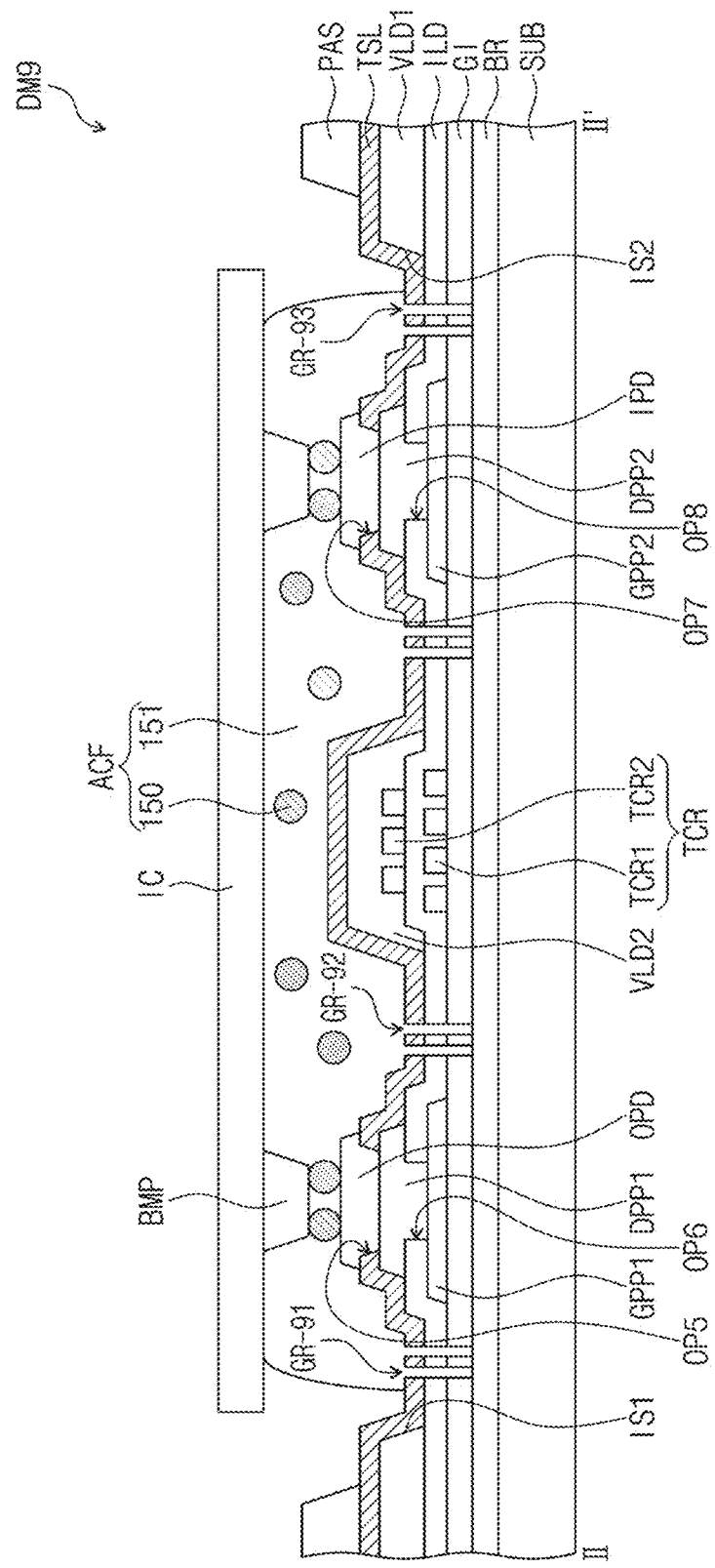
FIG. 26 is a cross-sectional view taken along line II-II' of FIG. 25.

FIG. 25 is an enlarged plan view illustrating a shape of an intaglio pattern, which is provided in the region 'AA' of FIG. 1, according to other exemplary embodiments of the invention, and FIG. 26 is a cross-sectional view taken along line II-II' of FIG. 25.

In a display apparatus DM9 shown in FIG. 25, an intaglio pattern GR-9 may include first to third intaglio patterns GR-91 to GR-93.

The first intaglio pattern GR-91 may be provided between the output pads OPD and the first inner side surface IS1 of the first intermediate insulating layer VLD1. In some exemplary embodiments, a plurality of the first intaglio patterns GR-91 may be provided. The first intaglio pattern GR-91 may be placed between, but not overlapped with, the output pad lines OPL. FIG. 25 illustrates an example in which a pair of the first intaglio patterns GR-91 are provided between a corresponding adjacent pair of the output pad lines OPL, but the invention is not limited thereto.

Since the first intaglio pattern GR-91 is not overlapped with the output pad lines OPL, the touch insulating layer TSL may cover the output pad lines OPL. Accordingly, although the touch insulating layer TSL has the first intaglio pattern GR-91, the touch insulating layer TSL may be used to protect the output pad lines OPL, and moreover, may contribute to reduce a signal interference issue, which may occur when a parasitic capacitor is provided between the output pad lines OPL.

The second intaglio pattern GR-92 may be provided between the second intermediate insulating layer VLD2 and the input pads IPD. The second intaglio pattern GR-92 may be provided in plural. The second intaglio pattern GR-92 may be placed between, but not overlapped with, the test pad lines TPL. FIG. 25 illustrates an example in which a pair of the second intaglio patterns GR-92 are provided between a corresponding adjacent pair of the test pad lines TPL, but the invention is not limited thereto. The second intaglio pattern GR-92 may have an effect similar to that of the first intaglio pattern GR-91.

The third intaglio pattern GR-93 may be provided between the input pads IPD and the second inner side surface IS2 of the first intermediate insulating layer VLD1. The third intaglio pattern GR-93 may be provided in plural. The third intaglio pattern GR-93 may be placed between, but not overlapped with, the input pad lines IPL. FIG. 25 illustrates an example in which a pair of the third intaglio patterns GR-93 are provided between a corresponding adjacent pair of the input pad lines IPL, but the invention is not limited thereto. The third intaglio pattern GR-93 may have an effect similar to that of the first intaglio pattern GR-91.

The first to third intaglio patterns GR-91 to GR-93 may be provided in the touch insulating layer TSL.

The first to third intaglio patterns GR-91 to GR-93 may not be overlapped with lines (e.g., the output pad lines OPL, the test pad lines TPL, and the input pad lines IPL), which are positioned at the same level as the gate pad pattern GPP. Thus, even when the first to third intaglio patterns GR-91 to GR-93 are extend below the touch insulating layer TSL, the output pad lines OPL, the test pad lines TPL, and the input pad lines IPL may not be exposed by the first to third intaglio patterns GR-91 to GR-93 and may be protected.

The first to third intaglio patterns GR-91 to GR-93 may have depths larger than a thickness of the touch insulating layer TSL. In an exemplary embodiment, the first to third intaglio patterns GR-91 to GR-93 may be extended to penetrate the interlayered insulating layer ILD and, moreover, to penetrate the gate insulating layer GI, for example. FIG. 26 illustrates an example in which the first to third intaglio patterns GR-91 to GR-93 penetrate the touch insulating layer TSL, the interlayered insulating layer ILD, and the gate insulating layer GI. In other exemplary embodiments, the first to third intaglio patterns GR-91 to GR-93 may expose an underlying layer (e.g., the barrier layer BR of FIG. 26) located under the gate insulating layer GI.

In the above embodiments described with reference to FIGS. 25 and 26, the first to third intaglio patterns GR-91 to GR-93 may be provided not only in the touch insulating layer TSL but also in layers provided below the touch insulating layer TSL, and this makes it possible to more effectively prevent a delamination problem, which may occur between the touch insulating layer TSL and the interlayered insulating layer ILD from being transferred to a neighboring region.

Figure 27:
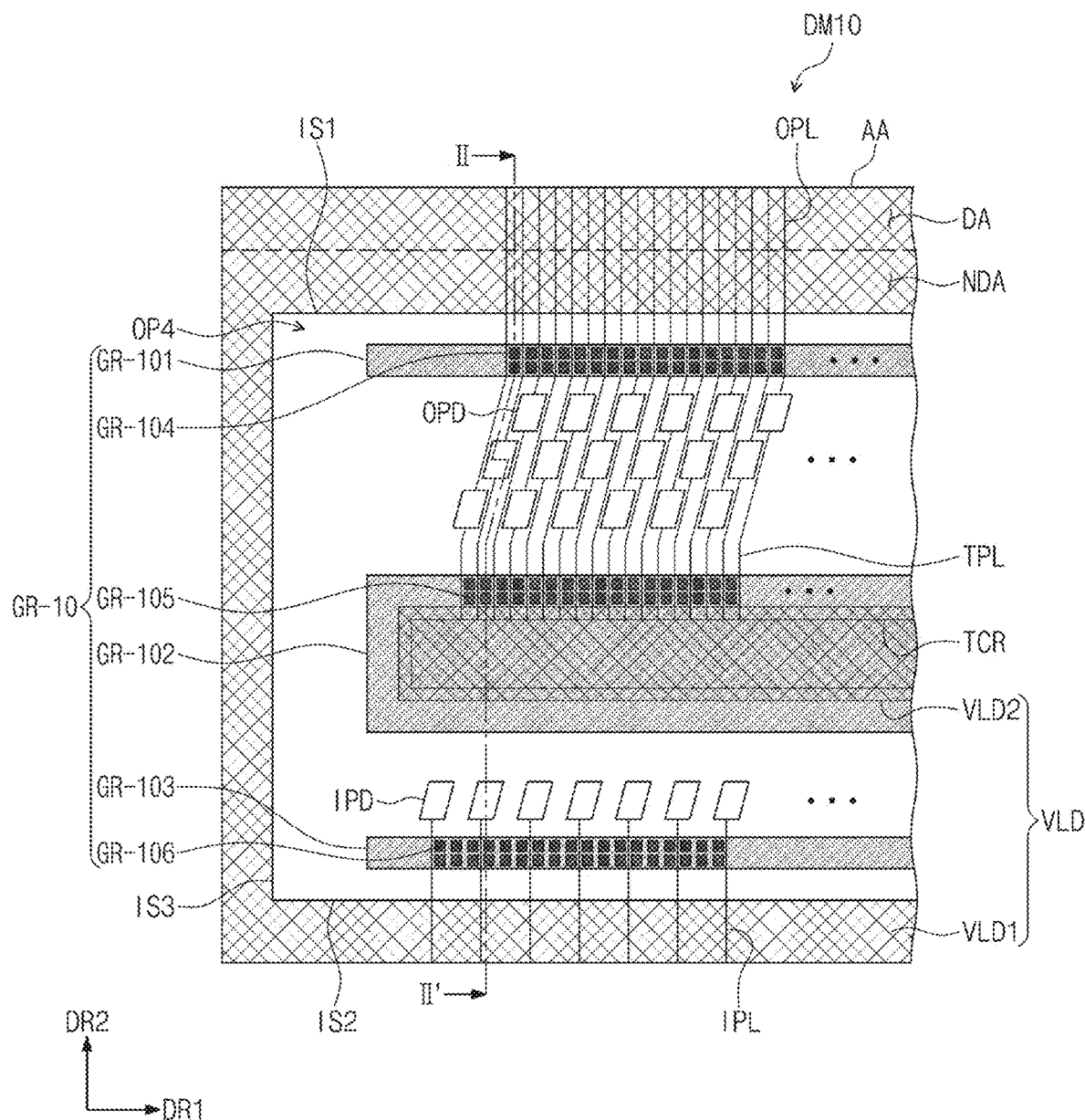
FIG. 27 is an enlarged plan view illustrating another exemplary embodiment of a shape of an intaglio pattern, which is provided in the region 'AA' of FIG. 1, according to the invention.
Figure 28:
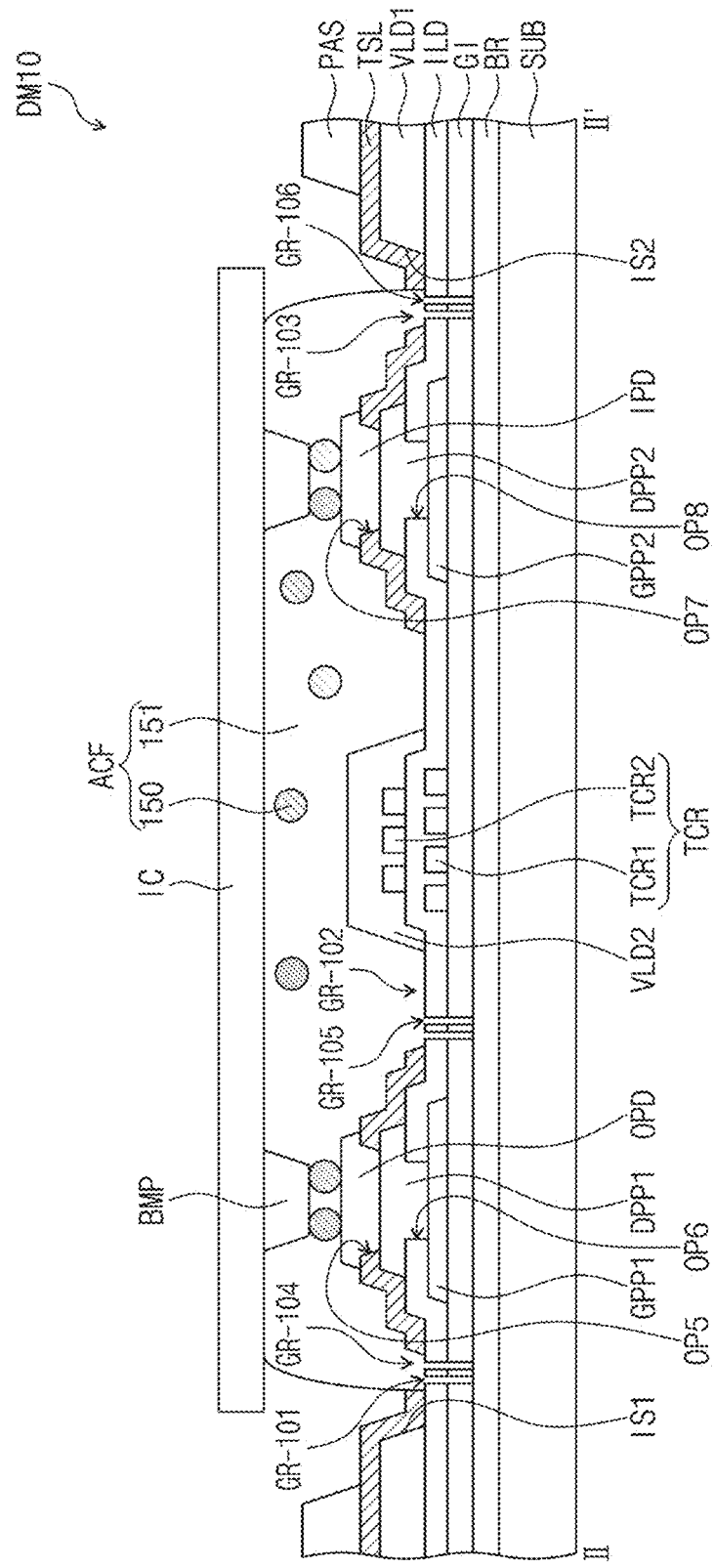
FIG. 28 is a cross-sectional view taken along line II-II' of FIG. 27.

FIG. 27 is an enlarged plan view illustrating a shape of an intaglio pattern, which is provided in the region 'AA' of FIG. 1, according to other exemplary embodiments of the invention, and FIG. 28 is a cross-sectional view taken along line II-II' of FIG. 27.

In a display apparatus DM10 shown in FIG. 27, an intaglio pattern GR-10 may include first to sixth intaglio patterns GR-101 to GR-106.

The first to intaglio patterns GR-101 to GR-103 may have substantially the same features as those of the first to third intaglio patterns GR1 to GR3 described with reference to FIGS. 8 and 9.

The fourth to sixth intaglio patterns GR-104 to GR-106 may have substantially the same features as those of the first to third intaglio patterns GR-91 to GR-93 described with reference to FIGS. 25 and 26.

The first intaglio pattern GR-101 and the fourth intaglio pattern GR-104 may be overlapped with each other. The second intaglio pattern GR-102 and the fifth intaglio pattern GR-105 may be overlapped with each other. The third intaglio pattern GR-103 and the sixth intaglio pattern GR-106 may be overlapped with each other.

A depth of each of the first to third intaglio patterns GR-101 to GR-103 may be less than that of each of the fourth to sixth intaglio patterns GR-104 to GR-106.

The first to third intaglio patterns GR-101 to GR-103 may be provided in the touch insulating layer TSL.

The fourth to sixth intaglio patterns GR-104 to GR-106 may be provided not only in the touch insulating layer TSL but also in at least one layer provided below the touch insulating layer TSL. FIG. 28 illustrates an example in which the fourth to sixth intaglio patterns GR-104 to GR-106 penetrate the touch insulating layer TSL, the interlayered insulating layer ILD, and the gate insulating layer GI.

In the case where the display apparatus DM10 described with reference to FIG. 27 is used, it may be possible to obtain not only the technical effect of the display apparatus DM described with reference to FIGS. 8 and 9 but also the technical effect of the display apparatus DM9 described with reference to FIGS. 25 and 26.

Figure 29:
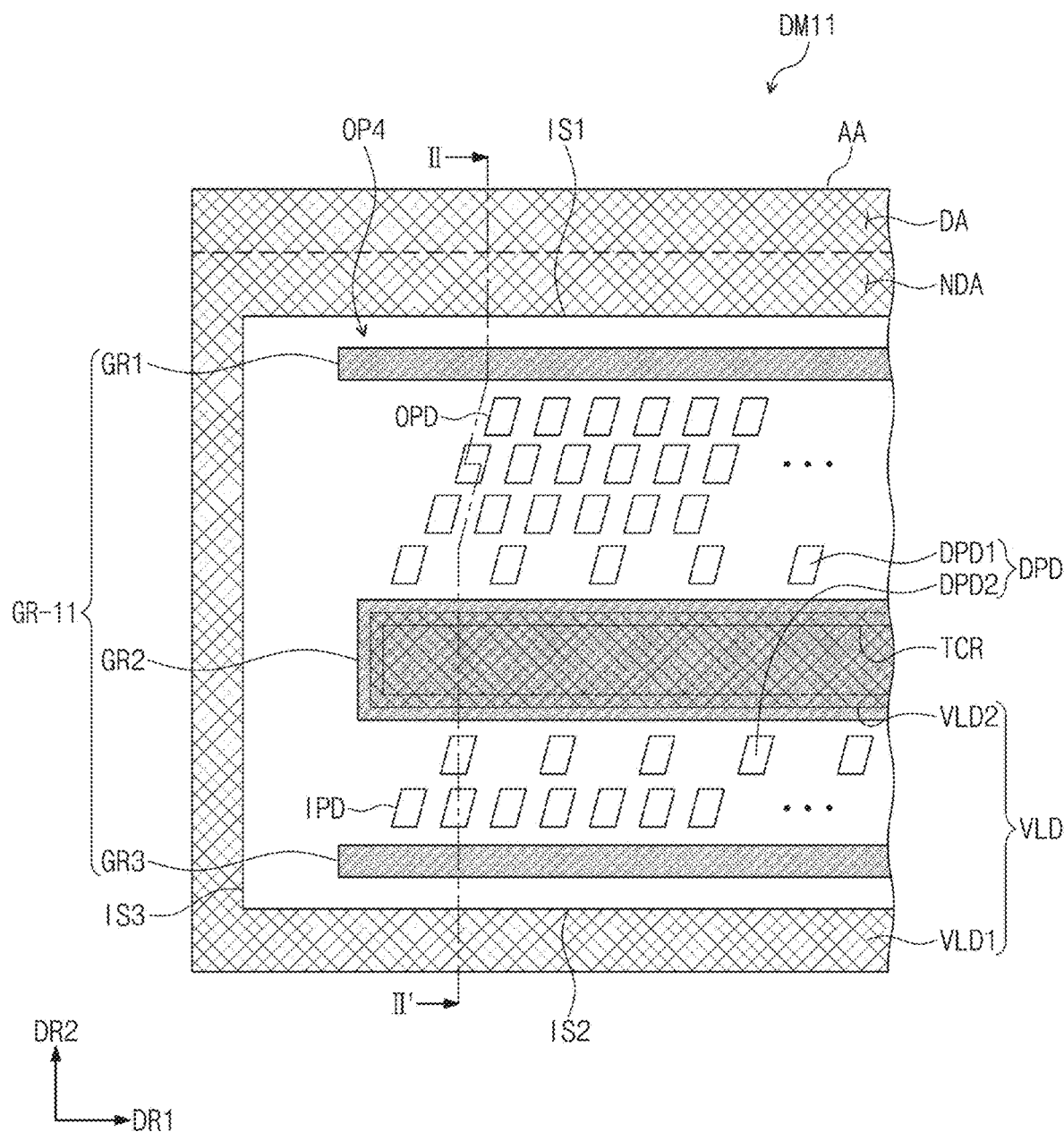
FIG. 29 is an enlarged plan view illustrating another exemplary embodiment of a shape of an intaglio pattern, which is provided in the region 'AA' of FIG. 1, according to the invention.
Figure 30:
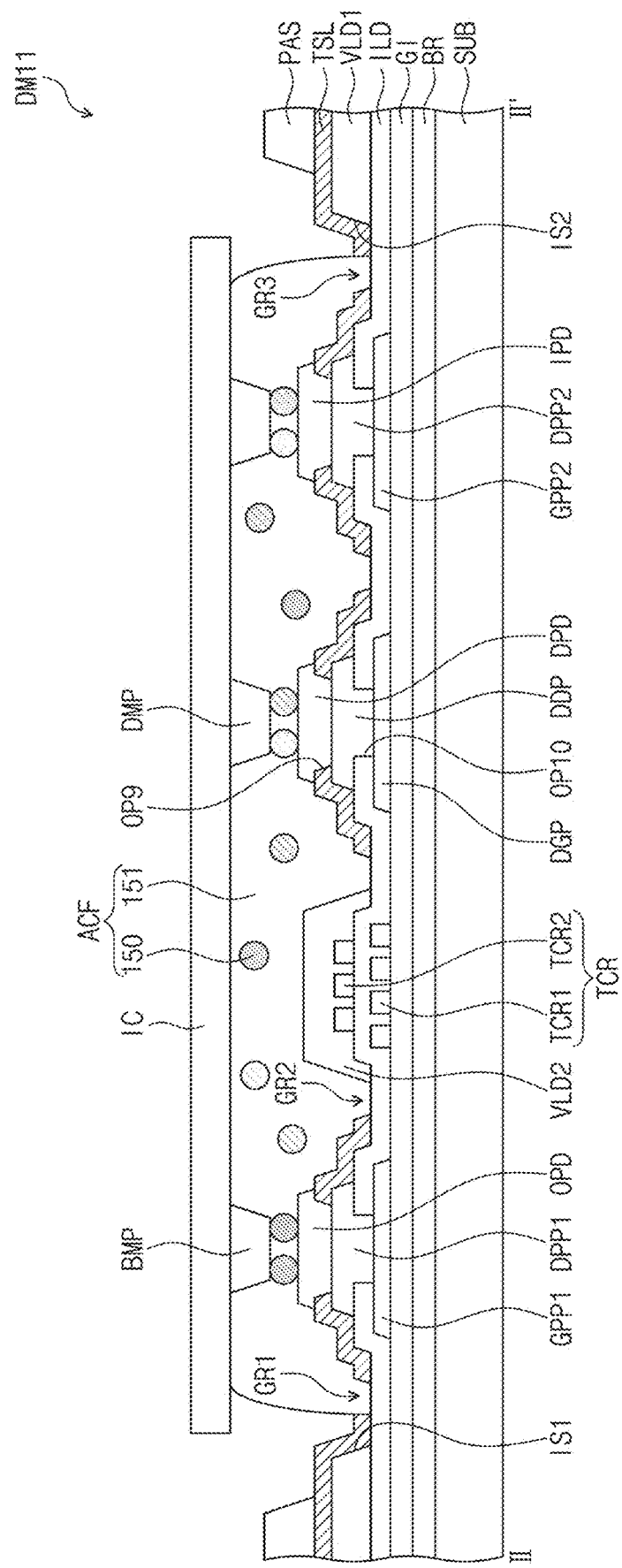
FIG. 30 is a cross-sectional view taken along line II-II' of FIG. 29.

FIG. 29 is an enlarged plan view illustrating a shape of an intaglio pattern, which is provided in the region 'AA' of FIG. 1, according to other exemplary embodiments of the invention, and FIG. 30 is a cross-sectional view taken along line II-II' of FIG. 29.

A display apparatus DM11 to be described with reference to FIGS. 29 and 30 may have substantially the same features as those of the display apparatus DM described with reference to FIGS. 8 and 9, except for a difference associated with a dummy pad DPD.

FIGS. 29 and 30 illustrate an example in which the intaglio pattern GR-11 is includes the first to third intaglio patterns GR1 to GR3 described with reference to FIGS. 8 and 9. However, the invention is not limited thereto, and for example, the intaglio pattern GR-11 in the display apparatus DM11 of FIGS. 29 and 30 may include one of the intaglio patterns of FIGS. 13 to 28.

The display apparatus DM11 may further include a dummy pad DPD and a dummy bump DMP. The dummy pad DPD may have the same structure as the output pad OPD and the input pad IPD. The dummy bump DMP may have the same structure as the bump BMP. The dummy pad DPD and the dummy bump DMP may contact each other. The dummy pad DPD may not be used to receive or transmit signals desired to operate the display apparatus DM11.

The dummy pad DPD may contact a dummy data pad pattern DDP through a ninth opening OP9 provided in the touch insulating layer TSL, and the dummy data pad pattern DDP may contact a dummy gate pad pattern DGP through a tenth opening OP10 provided in the interlayered insulating layer ILD.

The dummy pad DPD and the dummy bump DMP may be overlapped with the driving circuit chip IC. In a plan view, the dummy pad DPD may be provided between the second intermediate insulating layer VLD2 and the output pads OPD and/or between the second intermediate insulating layer VLD2 and the input pads IPD. In a plan view, the dummy pad DPD may be provided between the test circuit TCR and the output pads OPD. FIG. 29 illustrates an example in which the dummy pad DPD includes a first dummy pad DPD1, which is provided between the second intermediate insulating layer VLD2 and the output pads OPD, and a second dummy pad DPD2, which is provided between the second intermediate insulating layer VLD2 and the input pads IPD. The number of the dummy pads DPD may be variously changed.

When the driving circuit chip IC is disposed (e.g., mounted) on a display panel, pressure may be concentrated on the output pads OPD and the input pads IPD. Thus, stress may be concentrated on components of the display apparatus DM overlapped with the output pads OPD and the input pads IPD. In the previous embodiments described with reference to FIGS. 29 and 30, the dummy pad DPD and the dummy bump DMP may be overlapped with the driving circuit chip IC, thereby distributing the pressure concentrated on the output pads OPD and the input pads IPD.

Figure 31:
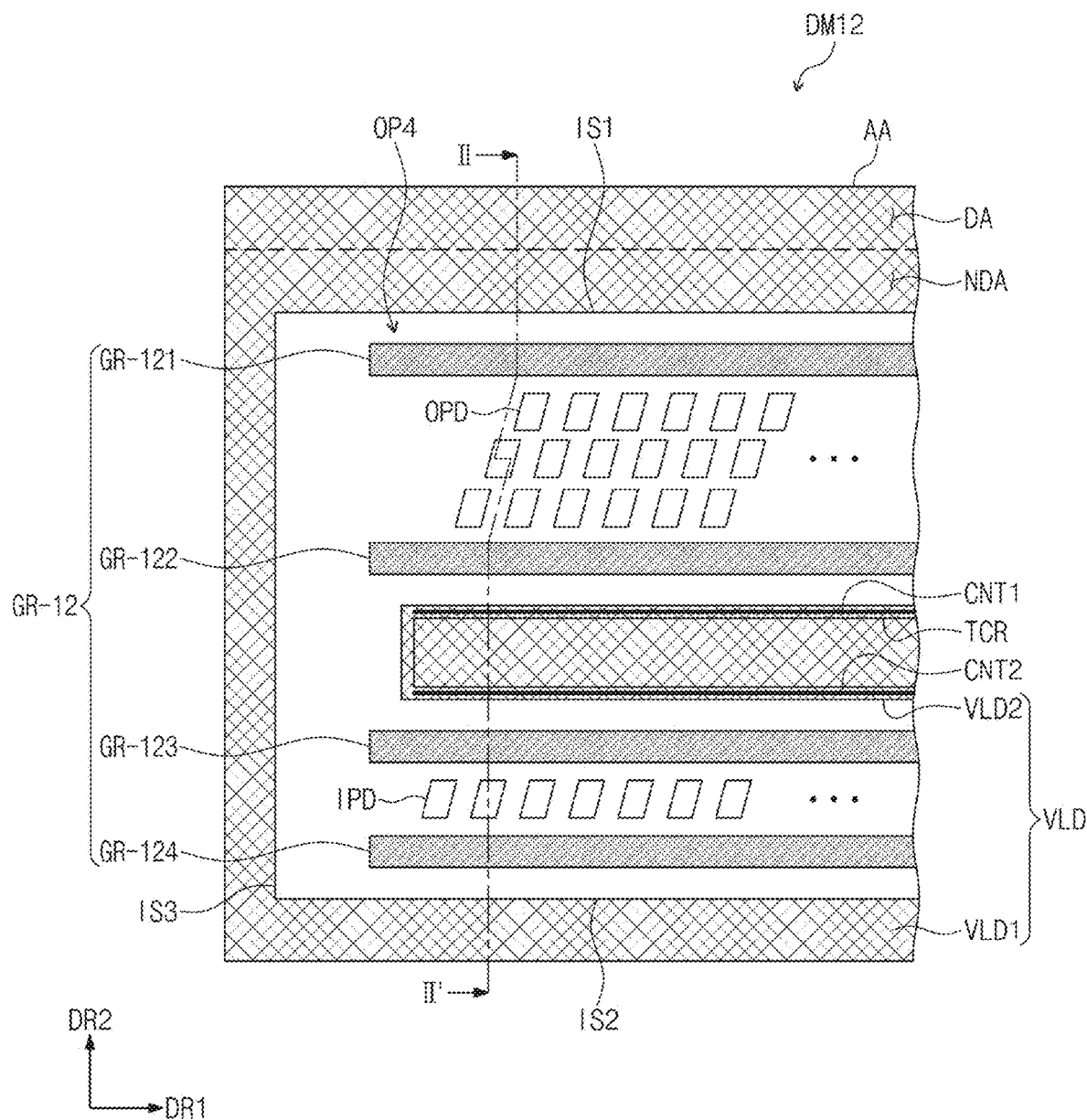
FIG. 31 is an enlarged plan view illustrating another exemplary embodiment of a shape of an intaglio pattern, which is provided in the region 'AA' of FIG. 1, according to the invention.
Figure 32:
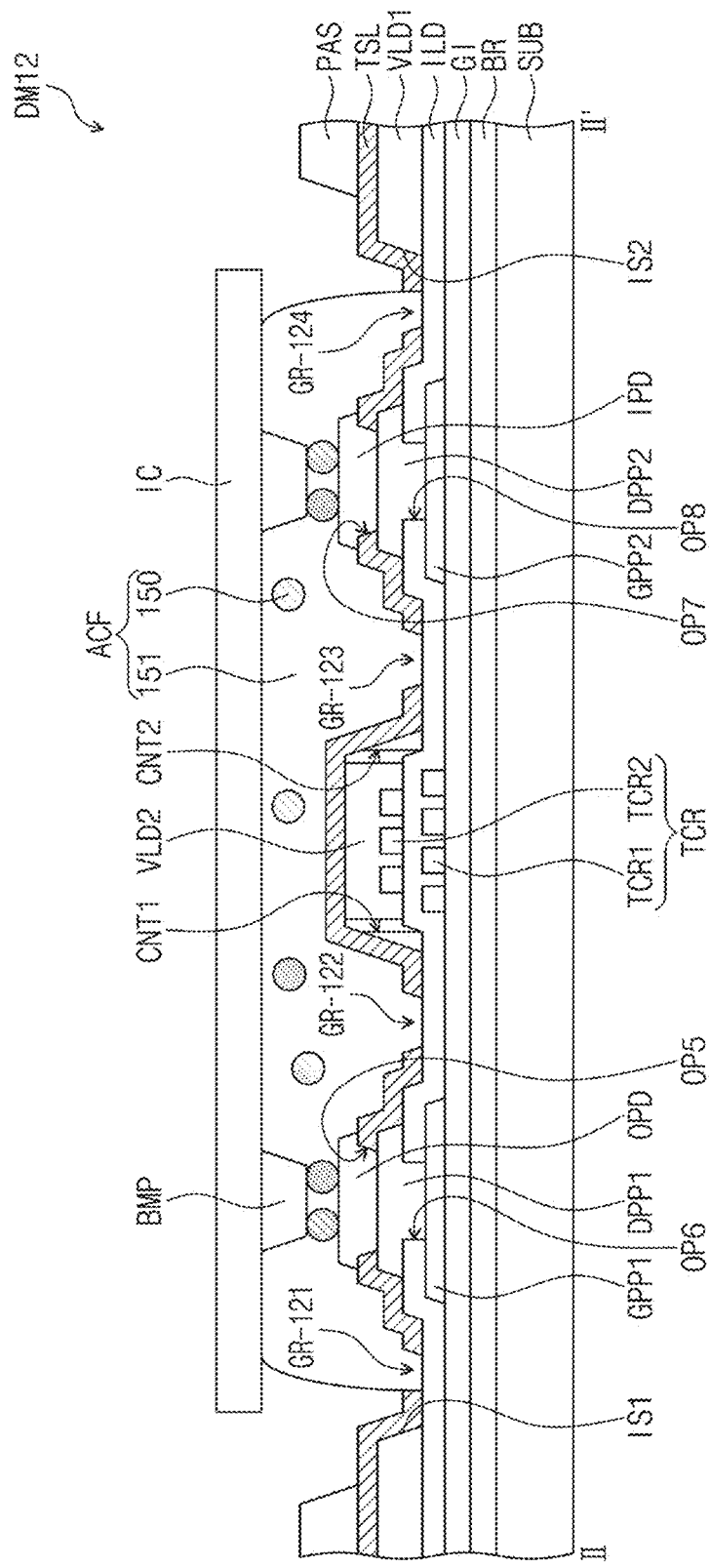
FIGS. 32 and 33 are cross-sectional views taken along line II-II' of FIG. 31.
Figure 33:
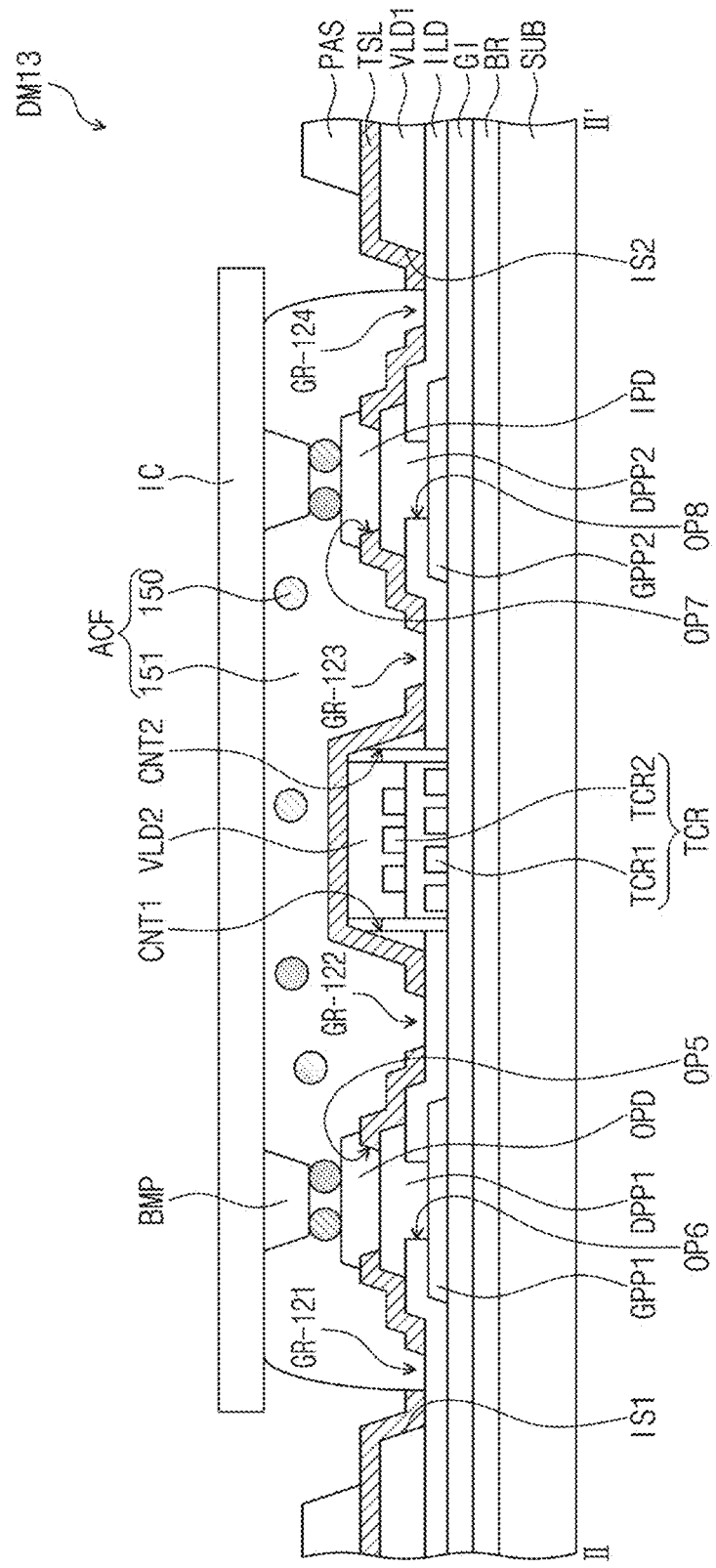

FIG. 31 is an enlarged plan view illustrating a shape of an intaglio pattern, which is provided in the region 'AA' of FIG. 1, according to other exemplary embodiments of the invention, and FIGS. 32 and 33 are cross-sectional views taken along line II-II' of FIG. 31.

In display apparatuses DM12 and DM13 of FIGS. 31 to 33, an intaglio pattern GR-12 is illustrated to have the first to fourth intaglio patterns GR-121 to GR-124 similar to the intaglio patterns described with reference to FIGS. 13 and 14. However, the invention is not limited thereto, and for example, in the display apparatuses DM12 and DM13 of FIGS. 31 to 33, the intaglio pattern GR-12 may include one of the intaglio patterns described with reference to FIGS. 8 to 28.

Referring to FIGS. 31 and 32, blocking holes CNT1 and CNT2 that are provided in the second intermediate insulating layer VLD2 may be defined in the display apparatus DM12. The blocking holes CNT1 and CNT2 may extend in the first direction DR1 in a plan view. The blocking holes CNT1 and CNT2 may not be overlapped with the test circuit TCR. The blocking holes CNT1 and CNT2 may include a first blocking hole CNT1 and a second blocking hole CNT2, which face each other with the test circuit TCR interposed therebetween in a plan view.

Referring to FIGS. 31 and 33, the blocking holes CNT1 and CNT2 which are provided not only in the second intermediate insulating layer VLD2 but also in the interlayered insulating layer ILD may be defined in the display apparatus DM13. The blocking holes CNT1 and CNT2 may penetrate both of the second intermediate insulating layer VLD2 and the interlayered insulating layer ILD.

Figure 34:
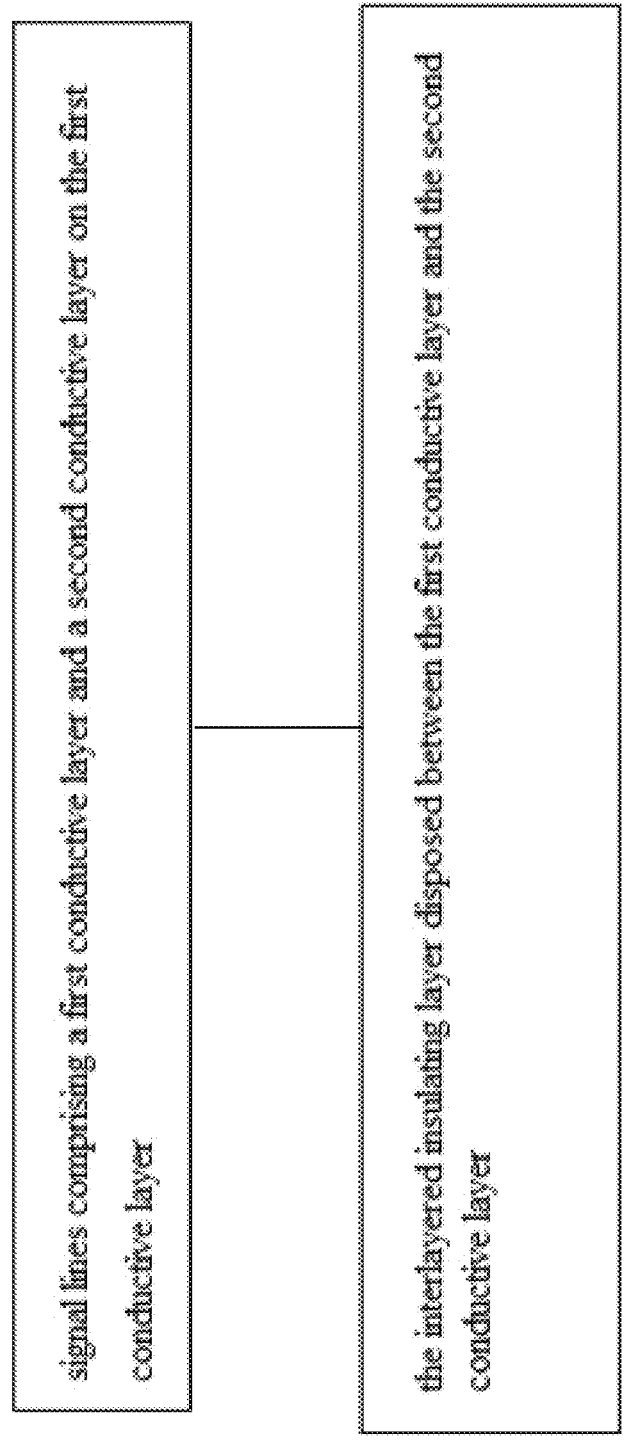
FIG. 34 is a diagram describing first and second conductive layers.

Referring to FIG. 34, the signal lines comprise a first conductive layer and a second conductive layer on the first conductive layer, and interlayered insulating layer ILD is disposed between the first conductive layer and the second conductive layer.

According to some exemplary embodiments of the invention, a display apparatus may include a touch insulating layer with an intaglio pattern. The intaglio pattern may prevent a delamination problem, which may occur between the touch insulating layer and an interlayered insulating layer, causing a short circuit between output and input pads.

While exemplary embodiments of the invention have been particularly shown and described, it will be understood by one of ordinary skill in the art that variations in form and detail may be made therein without departing from the spirit and scope of the attached claims.

What is claimed is:

1. A display apparatus, comprising:
   a substrate comprising a display region and a non-display region adjacent to the display region;
   pixels disposed in the display region and connected to data lines;
   output pad lines connected to the pixels;
   output pads connected to the input pad lines;
   a driving circuit chip disposed in the non-display region;
   an encapsulation layer covering the pixels; and
   a touch sensor disposed on the encapsulation layer and the touch sensor comprising a touch insulating layer comprising a first intaglio pattern defined by penetrating the touch insulating layer, and touch electrode layer, and
   wherein the output pad lines are connected to the output pads across the first intaglio pattern.

2. The display apparatus of claim 1, further comprising signal lines connected to the data lines, and
   wherein the output pad lines are connected to the signal lines.

3. The display apparatus of claim 1, wherein the touch insulation layer further comprises a second intaglio pattern defined by penetrating the touch insulating layer and spaced apart from the first intaglio pattern, and
   wherein the output pads disposed between the first intaglio pattern and the second intaglio pattern.

4. The display apparatus of claim 3, wherein the output pad lines cross at least one of the first intaglio pattern, the output pads, and the second intaglio pattern.

5. The display apparatus of claim 3, wherein the output pads comprises:
   first group pads arranged in a first direction;
   second group pads spaced apart from the first group pads in a second direction crossing the first direction and arranged in the first direction; and
   third group pads spaced apart from the second group pads in the second direction and arranged in the first direction.

6. The display apparatus of claim 3, wherein the second intaglio pattern overlaps with the driving circuit chip.

7. The display apparatus of claim 3, wherein each of the pixels comprises:
   a transistor comprising a semiconductor pattern, a gate disposed on the semiconductor pattern, a source and a drain connected to the semiconductor pattern, and a light emitting element connected to the transistor, and further comprising an interlayer insulating layer covering the gate, wherein the first intaglio pattern and the second intaglio pattern expose the interlayer insulating layer.

8. The display apparatus of claim 3, wherein the driving circuit chip is connected to the substrate through an anisotropic conductive film (ACF), and wherein the anisotropic conductive film (ACF) overlaps the first intaglio pattern and the second intaglio pattern.

9. The display apparatus of claim 1, further comprising input pads disposed in the non-display region and spaced apart from the output pads with the driving circuit chip interposed therebetween.

10. The display apparatus of claim 9, wherein touch insulating layer further comprises:

a second intaglio pattern defined by penetrating the touch insulating layer and overlapping the driving circuit chip, and a third intaglio pattern defined by penetrating the touch insulating layer and spaced apart from the second intaglio pattern with the input pads interposed therebetween.

11. A display apparatus, comprising:

a substrate comprising a display region and a non-display region adjacent to the display region;

pixels disposed in the display region and connected to data lines;

a pad group comprising input pad lines and input pads connected to the input pad lines;

a driving circuit chip disposed in the non-display region;

a flexible printed circuit board disposed in non-display region;

an encapsulation layer covering the pixels; and a touch sensor disposed on the encapsulation layer and the touch sensor comprising a touch insulating layer comprising a first intaglio pattern defined by penetrating the touch insulating layer, and touch electrode layer, and wherein the input pad lines connect the input pads and the flexible printed circuit board.

12. The display apparatus of claim 11, further comprising signal lines connected to the data lines, and wherein the signal lines are directly connected to the flexible printed circuit board across the first intaglio pattern.

13. The display apparatus of claim 11, wherein the flexible printed circuit board and the driving circuit chip are connected.

14. The display apparatus of claim 11, wherein the touch insulation layer further comprises a second intaglio pattern defined by penetrating the touch insulating layer and spaced apart from the first intaglio pattern, and wherein the second intaglio pattern disposed between the first intaglio pattern and input pads.

15. The display apparatus of claim 14, further comprising a test circuit overlapping the driving circuit.

16. The display apparatus of claim 15, wherein the second intaglio pattern overlaps the test circuit.

17. The display apparatus of claim 14, wherein each of the pixels comprises:

a transistor comprising a semiconductor pattern, a gate disposed on the semiconductor pattern, a source and a drain connected to the semiconductor pattern, and a light emitting element connected to the transistor, and further comprising an interlayer insulating layer covering the gate, wherein the first intaglio pattern and the second intaglio pattern expose the interlayer insulating layer.

18. The display apparatus of claim 14, wherein the driving circuit chip is connected to the substrate through an anisotropic conductive film (ACF), and wherein the anisotropic conductive film (ACF) overlaps the first intaglio pattern and the second intaglio pattern.

19. The display apparatus of claim 11, further comprising output pad lines connected to the pixels and output pads disposed in the non-display region and spaced apart from the input pads with the driving circuit chip interposed therebetween and connected to the output pad lines.

20. The display apparatus of claim 19, wherein touch insulating layer further comprises:

a second intaglio pattern defined by penetrating the touch insulating layer and overlapping the driving circuit chip, and a third intaglio pattern defined by penetrating the touch insulating layer and spaced apart from the second intaglio pattern with the input pads interposed therebetween.

* * * * *